(12) United States Patent
Ogawa et al.

(10) Patent No.: US 7,514,686 B2
(45) Date of Patent: Apr. 7, 2009

(54) RADIATION DETECTING APPARATUS, SCINTILLATOR PANEL, THEIR MANUFACTURING METHOD AND RADIATION DETECTING SYSTEM

(75) Inventors: Yoshihiro Ogawa, Hachioji (JP); Satoshi Okada, Zama (JP); Tomoyuki Tamura, Yokohama (JP); Shinichi Takeda, Honjo (JP); Kazumi Nagano, Fujisawa (JP); Masato Inoue, Kumagaya (JP); Katsuro Takenaka, Kodama-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 97 days.

(21) Appl. No.: 11/570,125

(22) PCT Filed: Jul. 27, 2005

(86) PCT No.: PCT/JP2005/014144

§ 371 (c)(1),
(2), (4) Date: Dec. 6, 2006

(87) PCT Pub. No.: WO2006/016505

PCT Pub. Date: Feb. 16, 2006

(65) Prior Publication Data

US 2007/0257198 A1    Nov. 8, 2007

(30) Foreign Application Priority Data

Aug. 10, 2004   (JP) .............................. 2004-233417

(51) Int. Cl.
*G01T 1/20* (2006.01)
(52) U.S. Cl. .............................. 250/361 R; 250/370.11
(58) Field of Classification Search ............. 250/361 R, 250/370.11
See application file for complete search history.

(56) References Cited

U.S. PATENT DOCUMENTS

| 4,803,359 | A | | 2/1989 | Hosoi et al. |
| 5,028,509 | A | | 7/1991 | Shimada et al. |
| 5,107,125 | A | * | 4/1992 | Powell et al. ............ 250/483.1 |

(Continued)

FOREIGN PATENT DOCUMENTS

EP          0 708 474 A1      4/1996

(Continued)

OTHER PUBLICATIONS

Search Report issued on Sep. 4, 2007 by the Taiwan Patent Office in connection with Taiwanese counterpart application.

*Primary Examiner*—David P Porta
*Assistant Examiner*—Marcus H Taningco
(74) *Attorney, Agent, or Firm*—Fitzpatrick, Cella, Harper & Scinto

(57) ABSTRACT

A radiation detecting apparatus includes a substrate 1, a scintillator layer 7 converting a radiation into light, and scintillator protection members 8, 9 and 10 to cover the scintillator layer 7, wherein the scintillator protection member includes a scintillator protection layer 8 consisting of a hot-melt resin, and the scintillator protection layer 8 touches the scintillator layer 7. As the substrate 1, there is provided a sensor panel including a photoreceiving layer 15 on which photoelectric conversion elements 2, receiving light, are arranged in a two-dimension array, and a protection layer 5 provided on the photoreceiving layer 15 and touching the scintillator layer 7 and the scintillator protection layer 8. By using such a scintillator protection layer, a film formation time of the scintillator protection layer can be shortened, and the film thickness dispersion of the scintillator protection layer can be suppressed. Moreover, the adhesion property to the scintillator foundation layer and to the reflective layer protection layer can be improved.

12 Claims, 10 Drawing Sheets

U.S. PATENT DOCUMENTS

| | | |
|---|---|---|
| 5,475,287 A | 12/1995 | Okuyama et al. |
| 6,191,392 B1 | 2/2001 | Hauf et al. |
| 6,262,422 B1 | 7/2001 | Homme et al. .......... 250/370.11 |
| 7,067,817 B2 * | 6/2006 | Suganuma et al. ..... 250/370.11 |
| 7,256,404 B2 * | 8/2007 | Inoue et al. ............ 250/370.11 |
| 7,391,029 B2 * | 6/2008 | Takeda et al. .......... 250/370.11 |
| 2002/0017613 A1 | 2/2002 | Homme et al. ......... 250/370.11 |

FOREIGN PATENT DOCUMENTS

| | | |
|---|---|---|
| EP | 903590 | 1/2002 |
| EP | 1 211 521 A1 | 6/2002 |
| EP | 1 211 521 B1 | 7/2005 |
| JP | 07-182703 | 7/1995 |
| JP | 2000-284053 | 10/2000 |
| JP | 2000-356679 | 12/2000 |
| JP | 2000-356679 A | 12/2000 |
| JP | 2003-021642 | 1/2003 |
| JP | 2003-329797 A | 11/2003 |
| TW | 395550 Y | 6/2000 |
| TW | 401510 B | 8/2000 |
| WO | WO98/36291 A1 | 8/1998 |
| WO | WO 00/63722 A1 | 10/2000 |

* cited by examiner

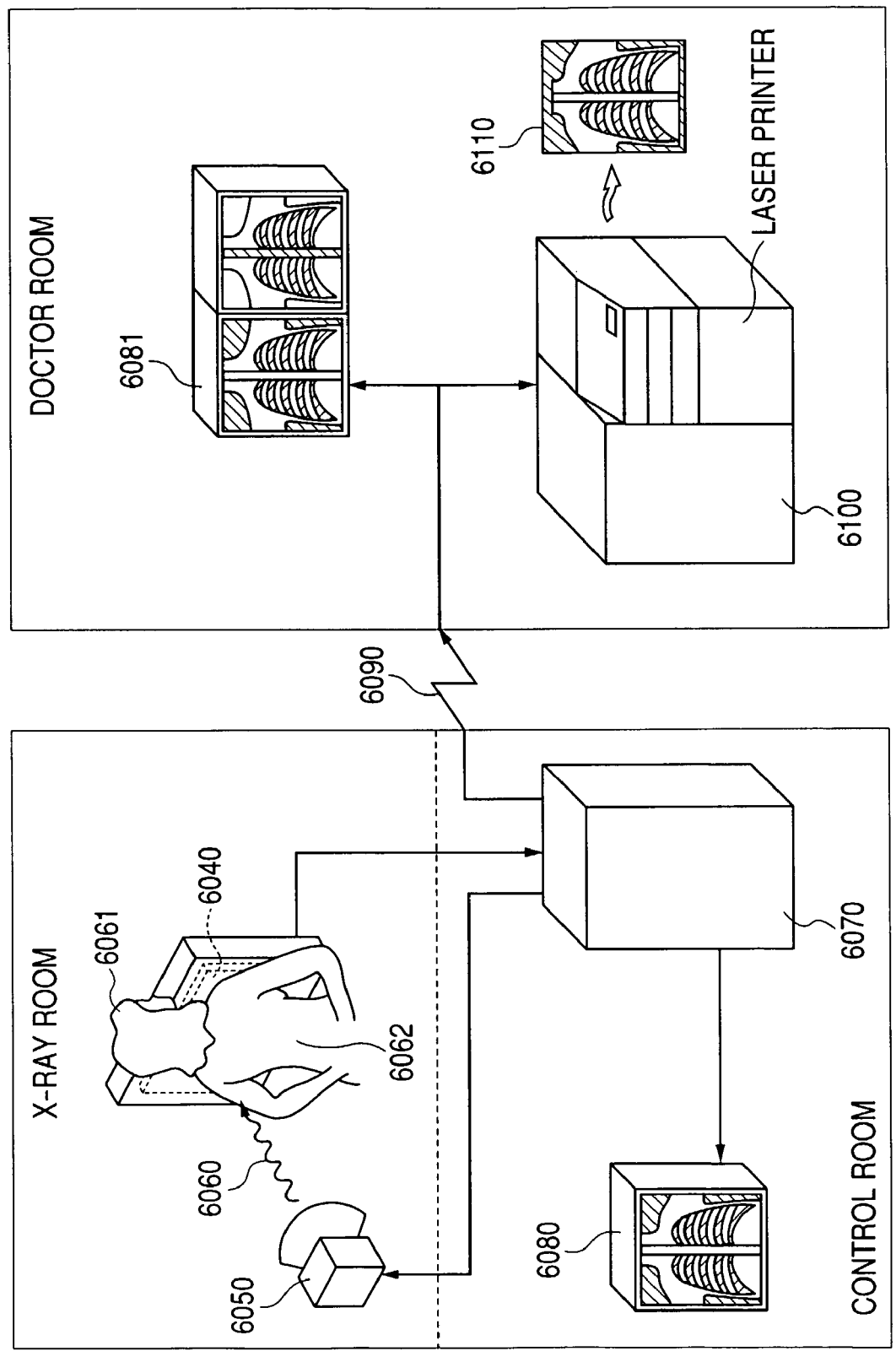

RADIATION DETECTING APPARATUS, SCINTILLATOR PANEL, THEIR MANUFACTURING METHOD AND RADIATION DETECTING SYSTEM

TECHNICAL FIELD

The present invention generally relates to a radiation detecting apparatus for detecting radiation and producing a corresponding electrical signal, used for a medical diagnostics apparatus, a non-destructive inspection device and the like, and more particularly to a protection layer of a scintillator of a columnar crystal of a radiation detecting apparatus having a scintillator layer (phosphor layer) of a columnar crystal structure. Incidentally, in the present specification, "radiation" includes electromagnetic waves and particular beams such as α rays, β rays, and γ rays, besides X-rays.

EXAMPLE BACKGROUND ART

In recent years, digital radiation detecting apparatuses have been commercialized. The known digital radiation detecting apparatus includes a scintillator (phosphor) layer laminated on at least the surface of a photoelectric conversion element formed on a large-area plane. The scintillator layer emits light responsive to X-ray irradiation. As disclosed in U.S. Pat. No. 6,262,422, U.S. Pat. No. 6,278,118 and the like, a radiation detecting apparatus (also called a "direct deposition type" or a "direct type") composed of a photodetector (also called a "sensor panel") and a scintillator layer formed directly on the photodetector is known as an apparatus having a high sensitivity and a high sharpness among the digital radiation detecting apparatuses. The photodetector is composed of a photoelectric conversion element unit in which a plurality of electric elements such as photosensors and TFTs is two-dimensionally arranged. The scintillator layer is for converting radiation to light capable of being detected by the photoelectric conversion element.

As disclosed in U.S. Patent Application Publication No. 2002/17613 and the like, a radiation detecting apparatus (also called a "paste together type", or "indirect type") composed of a photodetector and a scintillator panel bonded together with the photodetector is known. The photodetector is composed of a photoelectric conversion element unit in which a plurality of electric elements such as photosensors and thin film transistors (TFTs) is two-dimensionally arranged. The scintillator panel is composed of a scintillator layer formed on a supporting substrate. The scintillator layer is for converting radiation to light capable of being detected by the photoelectric conversion element. As the scintillator layer, for example, a material containing CsI having a columnar crystal structure formed by evaporation as the principal component is known. In order to prevent the penetration of moisture from the outside into such a scintillator layer, it is practiced to form a scintillator protection layer. In particular, the CsI material is an absorbent material, and consequently a problem of deterioration of resolution caused by the absorption of moisture by the CsI material can easily occur.

U.S. Pat. No. 6,262,422 discloses the radiation detecting apparatus produced by preparing the photodetector by forming a protection layer on the surface of the photoelectric conversion element unit formed on the surface of a glass substrate, by forming the scintillator layer made of CsI having the columnar crystal structure directly on the surface of the protection layer by the evaporation method, and by forming a scintillator protection layer consisting of an organic thin film by the CVD method so as to cover the surfaces of the photodetector and the scintillator layer. Poly-para-xylylene is disclosed as a material of the organic thin film.

U.S. Pat. No. 6,278,118 discloses a radiation detecting apparatus produced by forming the scintillator layer made of CsI having the columnar crystal structure on the surface of the photodetector with a protection layer put between them by the evaporation method, and by forming a scintillator protection layer so as to cover the surfaces of the photodetector and the scintillator layer, and further by providing a covering resin making the periphery of the scintillator protection layer adhere closely to the surface of the photodetector.

U.S. Patent Application Publication No. 2002/017613A discloses a radiation detecting apparatus produced by pasting the scintillator panel together on the photodetector. The scintillator panel is formed on a supporting substrate made of a carbon substrate and then, sequentially, a reflective layer consisting of a reflective metal thin film, the scintillator layer formed on a supporting member arranging a scintillator foundation layer thereon by evaporation, and the scintillator protection layer consisting of an organic film (poly-para-xylylene) provided so as to cover the surface of the supporting member and the scintillator layer.

However, there is a case where an abnormal growth (splash) defect is generated in the scintillator layer, which has the columnar crystal structure formed by the evaporation and consists of alkali halide such as CsI:Na and CsI:Tl, at the time of the formation of the scintillator layer. In particular, in a radiation detecting apparatus for radiographing a human body, the thickness of the scintillator layer is needed to be 400 μm or more, and the abnormal growth parts sometimes become projections each having a diameter of 300 μm or more and a height of 20 μm or more in that case. Furthermore, there is a case where concave portions each having a depth of 20 μm or more in a doughnut shape are formed around each of the abnormal growth parts in the projections. The inventors found that the thickness of the scintillator protection layer was required to be 20 μm or more for covering the abnormal growth defect parts of the scintillator layer including such projections and concave portions to satisfy the need for moisture proofing. However, because the scintillator protection layer using the organic film made of poly-para-xylylene disclosed in the above-mentioned patent document is formed by the CVD method, the film formation speed of the scintillator protection layer is about 100 to 2000 angstroms/minute, which is slow, and the film formation time required for forming a 20 μm scintillator protection layer is correspondingly between 100 minutes and 2000 minutes. Consequently, the prior art has the problem that productivity is poor.

Moreover, when the scintillator protection layer consisting of an organic film made of poly-para-xylylene used for a large-area radiation detecting apparatus (for example, 43 cm×43 cm) such as an X-ray digital camera is formed as a film by the CVD method, the film thickness distribution in the surface of the scintillator protection layer becomes large. When the light emitted by the scintillator layer is reflected by a reflection film to enter the photoelectric conversion element in the radiation detecting apparatus like ones disclosed in the above-mentioned prior art documents 1 and 2, optical path lengths are different from one another owing to the film thickness distribution in the surface of the scintillator protection layer. As a result, the organic film has a problem that the resolution of the acquired image decreases. Moreover, in the radiation detecting apparatus like the above-mentioned prior art technical document 3, when the light emitted by the scintillator protection layer enters a light receiving element, differences are generated in optical path lengths by the film thickness distribution in the surface of the scintillator protection layer, and consequently this radiation detecting apparatus also has the problem that the resolution of the acquired image decreases.

Moreover, the organic film made of poly-para-xylylene has the following problems. First, the organic film does not adhere well with the protection layers of the patent documents 1 and 2 and the scintillator foundation layer of the patent document 3, and exfoliation or a gap is generated at the interface between the scintillator protection layer and the protection layer, or the interface between the scintillator protection layer and the scintillator foundation layer. Consequently, the organic film suffers from the problem that the moisture resistance and the shock resistance are both lower at the interface between the scintillator protection layer and the protection layer, and at the interface between the scintillator protection layer and the scintillator foundation layer. Moreover, although the prior art disclosed in the patent documents 1 and 2 secures the moisture resistance and the shock resistance by providing a covering resin at the ends of the scintillator protection layer end, this also has the problem that the configuration may increase in cost.

SUMMARY OF THE INVENTION

For solving the foregoing problems, a radiation detecting apparatus according to the present invention is a radiation detecting apparatus including a substrate, a scintillator layer formed on the substrate to convert a radiation into light, and a scintillator protection layer covering the scintillator layer to adhere closely to the scintillator protection layer, wherein the scintillator protection layer is made of a hot-melt resin. As the substrate, a sensor panel equipped with a photoreceiving layer on which photoelectric conversion elements receiving the light are two-dimensionally arranged, and a protection layer provided on the photoreceiving layer to touch the scintillator layer and the scintillator protection layer can be used. Moreover, as the substrate, a substrate including a supporting member composed of a supporting substrate, a reflective layer provided on the supporting substrate to reflect the light converted by the scintillator layer, and a scintillator foundation layer provided on the reflective layer to touch the reflective layer and the scintillator protection layer can be used.

Moreover, a scintillator panel of the present invention is a scintillator panel including a supporting member, a scintillator layer formed on the supporting member to convert a radiation into light, and a scintillator protection layer covering the scintillator layer to adhere closely to the supporting member, wherein the scintillator protection layer is made of a hot-melt resin.

A manufacturing method of a radiation detecting apparatus and a scintillator panel of the present invention is a method used for manufacturing the radiation detecting apparatus and the scintillator panel of the present invention. That is, the manufacturing method of the radiation detecting apparatus of the present invention is a manufacturing method of a radiation detecting apparatus including a substrate, a scintillator layer formed on the substrate to convert a radiation into light, and a scintillator protection layer covering the scintillator layer to adhere closely to the scintillator protection layer, the method including the step of preparing the substrate, on which the scintillator layer is formed, and providing a melted hot-melt resin to cover the scintillator layer directly for forming the scintillator protection layer.

The manufacturing method of the scintillator panel of the present invention is a manufacturing method of a scintillator panel including a supporting member, a scintillator layer formed on the supporting member to convert a radiation into light, and a scintillator protection layer covering the scintillator layer to adhere closely to the supporting member, the method including the step of preparing the supporting member, on which the scintillator layer is formed, and providing a melted hot-melt resin to cover the scintillator layer directly for forming the scintillator protection layer.

Moreover, the manufacturing method of the radiation detecting apparatus of the present invention is a manufacturing method of a radiation detecting apparatus including a substrate, a scintillator layer formed on the substrate to convert a radiation into light, and a scintillator protection layer covering the scintillator layer to adhere closely to the scintillator protection layer, the method including the step of forming a scintillator protection member having a scintillator protection layer made of a hot-melt resin, and the step of preparing the substrate, on which the scintillator layer is formed to make the scintillator protection member to the scintillator layer and the substrate so that the scintillator protection layer may touch the scintillator layer.

Moreover, the manufacturing method of the scintillator panel of the present invention is a manufacturing method of a scintillator panel including a supporting member, a scintillator layer formed on the supporting member to convert a radiation into light, and a scintillator protection layer covering the scintillator layer to adhere closely to the supporting member, the method including the step of forming a scintillator protection layer made of a hot-melt resin, and the step of preparing the supporting member, on which the scintillator layer is formed, and making the scintillator protection member adhere closely to the scintillator layer and the supporting member so that the scintillator protection layer may touch the scintillator layer.

According to the present invention, the film formation time of a scintillator protection layer is shortened and the productivity is improved. Moreover, the film thickness dispersion of the scintillator protection layer can be suppressed. Furthermore, the adhesion property of the scintillator protection layer with the scintillator foundation layer or a reflective layer protection layer can be improved.

BRIEF DESCRIPTION OF THE DRAWINGS

FIG. 13 is a view illustrating a radiation detecting system using the radiation detecting apparatus according to the present invention.

BEST MODE FOR PERFORMING THE INVENTION

The preferred embodiments of the present invention are described in detail below with reference to the attached drawings.

First Embodiment

Figure 1:
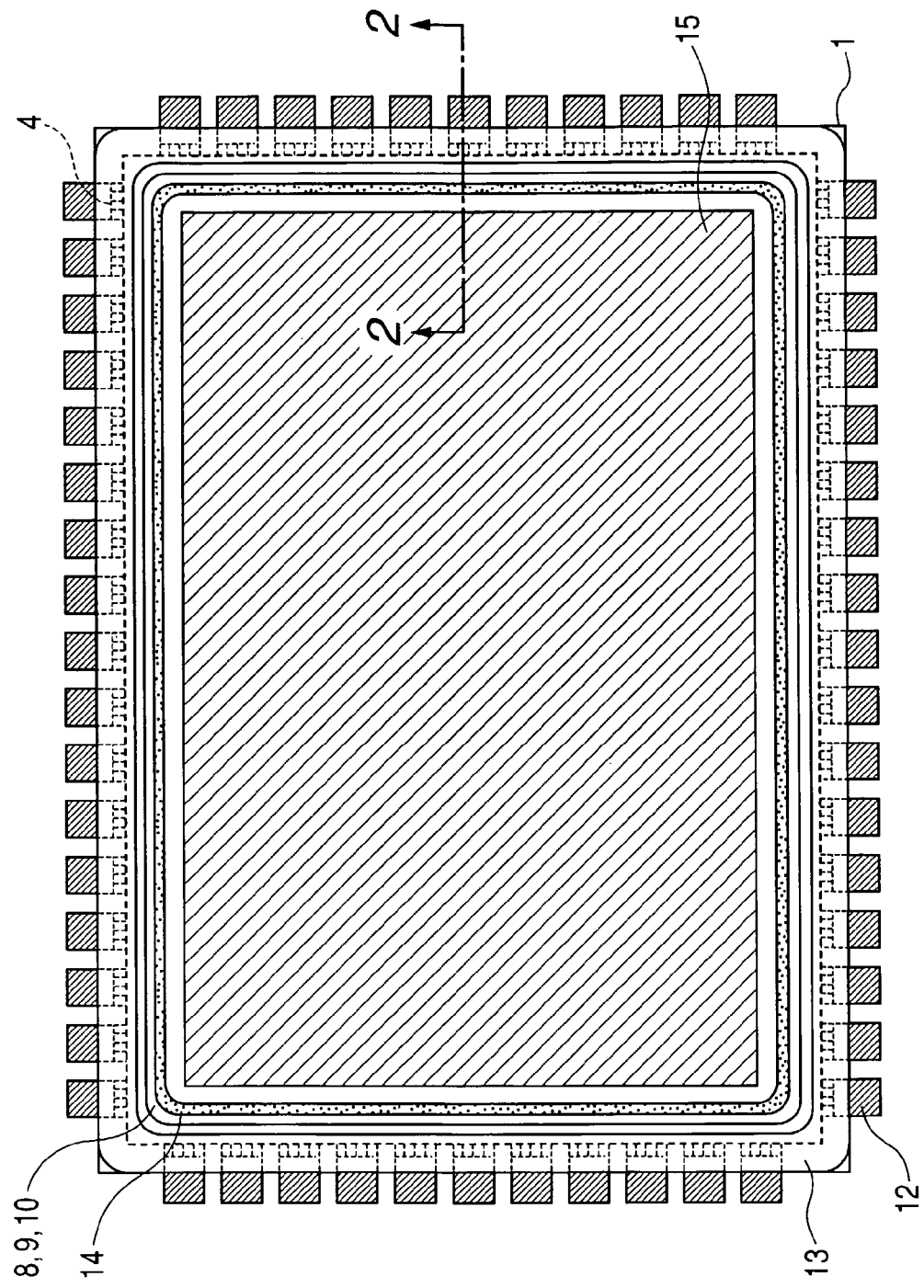
FIG. 1 is a schematic plan view of a radiation detecting apparatus according to a first embodiment of the present invention.
Figure 2:
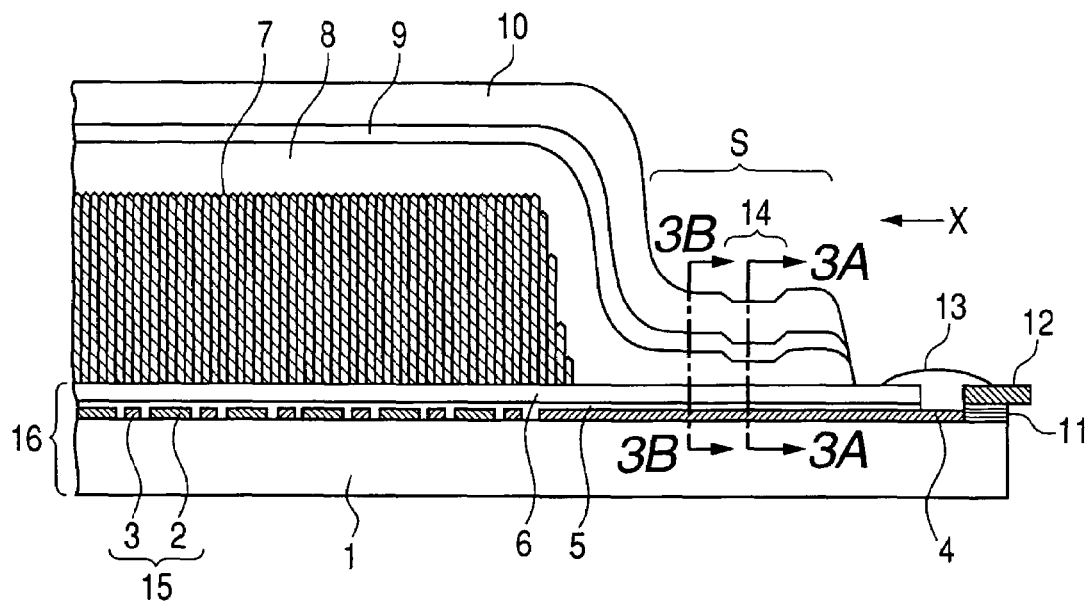
FIG. 2 is a sectional view of the radiation detecting apparatus shown in FIG. 1 taken along a 2-2 line.

FIG. 1 shows a schematic plan view of a direct deposition type radiation detecting apparatus according to the present invention. FIG. 2 is a sectional view taken along a line 2-2 of FIG. 1. In FIGS. 1 and 2, a reference numeral 1 denotes a substrate such as glass. A reference numeral 2 denotes a photoelectric conversion element. A reference numeral 3 denotes a wire. The photoelectric conversion elements 2, the wires 3 and thin film transistors (TFTs) constitute a photoreceiving layer 15. A reference numeral 4 denotes an electronic connection portion (fetch wire). A reference numeral 5 denotes a sensor protection layer. A reference numeral 6 denotes a scintillator foundation layer. A reference numeral 11 denotes a wire connecting portion. The substrate 1, the photoelectric conversion elements 2, the wires 3, the electronic connection portion 4, the sensor protection layer 5, the scintillator foundation layer 6 and the wire connecting portion 11 constitute a photodetector (sensor panel) 16. Moreover, a reference numeral 7 denotes a scintillator layer. A reference numeral 8 denotes a scintillator protection layer. A reference numeral 9 denotes a reflective layer. A reference numeral 10 denotes a reflective layer protection layer. The scintillator protection layer 8, the reflective layer 9 and the reflective layer protection layer 10 constitute a scintillator protection member. Moreover, a hot press portion 14 is formed in a region of the scintillator protection member which surrounds the region where the photoreceiving layer 15 or the scintillator layer 7 is formed and touches the sensor panel 16. Moreover, a reference numeral 12 denotes a wire member. A reference numeral 13 denotes a sealing member.

On the substrate 1, the photoreceiving layer 15, composed of the photoelectric conversion elements 2, the wires 3 and the TFTs (not shown), is formed. Glass, heat-resisting plastic or the like can be suitably used as the material of the substrate 1. The photoelectric conversion elements 2 convert the light converted from radiation by the scintillator layer 7 into electric charges. For example, materials such as amorphous silicon can be used as the photoelectric conversion elements 2. The configuration of each of the photoelectric conversion elements 2 is not especially limited, but an MIS-type sensor, a PIN-type sensor, a TFT-type sensor, and the like can be use suitably. The wires 3 show a part of signal wires and bias wires for applying a voltage (Vs) to the photoelectric conversion elements 2. The electronic connection portion 4 shows a signal wire or a drive wire. A signal having received the photoelectric conversion by a photoelectric conversion element 2 is read by a TFT, and is outputted to a signal processing circuit through a signal wire. Moreover, the gates of the TFTs arranged in the row directions connected to a drive wire for every row, and the TFTs are selected by a TFT drive circuit by every row. The signal processing circuit and the TFT drive circuit are provided out of the substrate 1, and are connected with the photoelectric conversion elements 2 or the TFTs through the electronic connection portion 4, the wire connecting portion 11 and the wire member 12. The sensor protection layer 5 is for covering and protecting the photoreceiving layer 15. As the sensor protection layer, inorganic films such as SiN and $SiO_2$ are preferable. The scintillator foundation layer 6 is formed on the sensor protection layer 5. As the material of the scintillator foundation layer 6, a heat-resistant resin consisting of an organic material such as polyimide and para-xylylene is preferable. For example, it is possible to use thermoset type polyimide resin and the like. The sensor protection film 5 and the scintillator foundation layer 6 severally have a function of protecting the photoelectric conversion elements. Moreover, the scintillator foundation layer 6 has a function of flattening the surface of the sensor panel 16. Moreover, in order to improve the adhesion property of the surface of the scintillator foundation layer 6 with the scintillator layer, the activation processing such as atmospheric pressure plasma processing may be suitably applied to the surface of the scintillator foundation layer 6. The scintillator layer 7 converts a radiation into light sensible by the photoelectric conversion element 2. It is preferable that the scintillator layer 7 is a scintillator having a columnar crystal structure. Because the light generated in the scintillator having the columnar crystal structure propagates the inside of the columnar crystal, the light is little scattered, and the resolution can be improved. However, materials other than those having the columnar crystal structure may be used as the scintillator layer 7. As the material of the scintillator layer 7 having the columnar crystal structure, the materials containing alkali halide as the principal components are used. For example, CsI:Tl, CsI:Na and CsBr:Tl are used. For example, the manufacturing method of CsI:Tl is one forming by evaporating CsI and TlI simultaneously. The scintillator protection layer 8 has a moisture-proof protection function preventing the penetration of moisture from the outside air to the scintillator layer 7 and a shock protection function of preventing structural disorder of the scintillator layer 7 owing to a shock. The thickness of the scintillator protection layer 8 is preferably within a range of from 20 to 200 μm. When the thickness is 20 μm or less, the asperity and the splash defects of the surface of the scintillator layer 7 cannot be completely covered, and there is the possibility that the moisture-proof protection function lowers. On the other hand, when the thickness exceeds 200 μm, the scattering of the light generated in the scintillator layer 7 or of the light reflected by the reflective layer increases in the scintillator protection layer 8, and there is a possibility that the resolution and the modulation transfer function (MTF) of the acquired image increase as a result. The present invention is characterized by using a hot-melt resin as the scintillator protection layer 8. The description of the scintillator protection layer using the hot-melt resin will be separately given later.

The reflective layer 9 has a function of improving light availability by reflecting the light advancing to the opposite side to the photoelectric conversion elements 2 among the light converted and emitted by the scintillator layer 7 to guide the light to the photoelectric conversion elements 2. Moreover, the reflective layer 9 further has a function of blocking the entering of the external light rays other than the light generated by the scintillator layer 7 into the photoelectric conversion elements 2 to preventing the entering of noises into the photoelectric conversion elements 2. As a reflective layer 9, it is preferable to use metal foil or a metal thin film, and the thickness of the reflective layer 9 is preferably within a range of from 1 to 100 μm. When the thickness is thinner than 1 μm, pinhole defects are easily generated at the time of the formation of the reflective layer 9, and the light blocking property becomes inferior. On the other hand, when the thickness exceeds 100 μm, there is the possibility that the amount of absorption of radiations is large and the increase of the dose of the exposure of a person to be radiographed is led to. Moreover, there is the possibility that it becomes difficult to cover the step between the scintillator layer 7 and the surface of the sensor panel 16 without any gap. As the material of the reflective layer 9, not specifically limited metallic materials such as aluminum, gold, copper and aluminum alloy can be used. As the materials having a high reflection property, aluminum and gold are preferable. The reflective layer protection layer 10 has a function of preventing the reflective layer 9 from being broken by a shock and being corroded by moisture. It is preferable to use a resin film as the reflective layer protection layer 10. As the material of the reflective layer protection layer 10, it is preferable to use film materials such as polyethylene terephthalate, polycarbonate, vinyl chloride, polyethylene naphtahalate and polyimide. The thickness of the reflective layer protection layer 10 is preferable within a range of from 10 to 100 μm.

The wire connecting portion 11 is a member for connecting the electronic connection portion 4 and the wire member 12 electrically, and is electrically connected with the wire member 12 with an anisotropic conductive adhesive or the like. The wire member 12 is a member installing IC parts and the like thereon for reading the electric signals converted by the photoelectric conversion element 2. A tape carrier package (TCP) and the like are used suitably. The sealing member 13 has the following functions to the wire member 12 and the electronic connection portion 4: a function of preventing the corrosion owing to moisture, a function of preventing the breakage owing to a shock, and a function of preventing the static electricity causing the breakage of the photoreceiving layer 15 which static electricity is generated at the manufacturing.

Figure 3A:
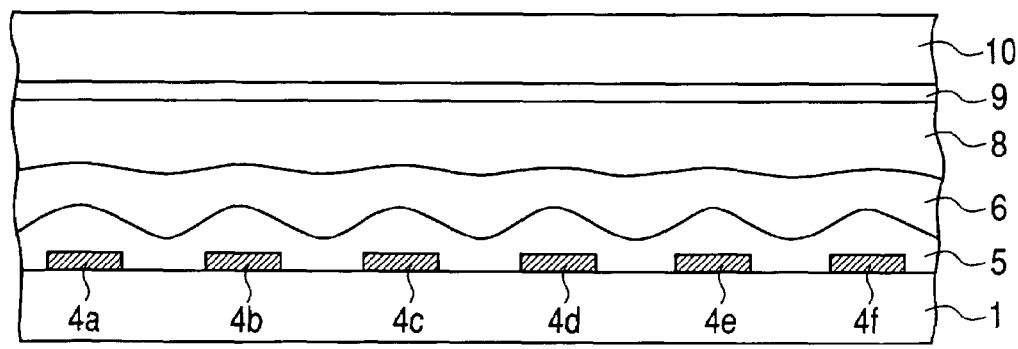
FIG. 3A is a sectional view taken along line 3A-3A in FIG. 2.
Figure 3B:
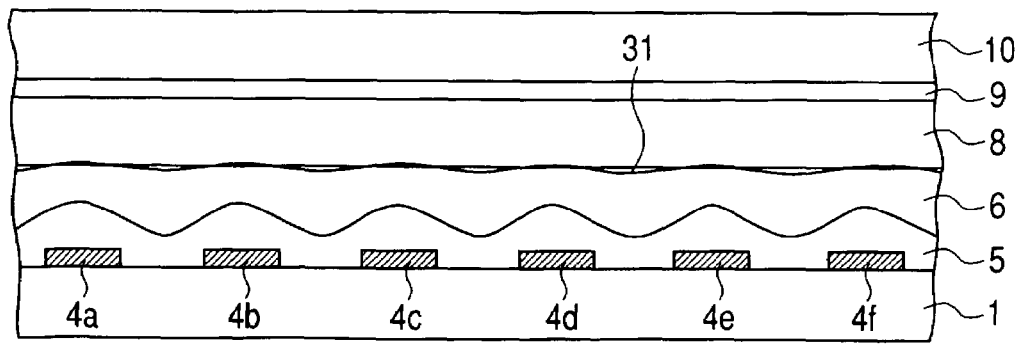
FIG. 3B is a sectional view taken along line 3B-3B in FIG. 2.
Figure 14A:
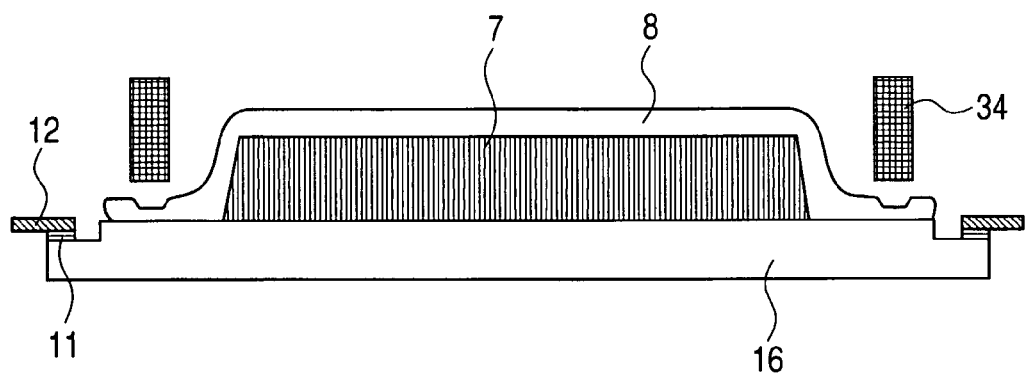
FIGS. 14A and 14B are views showing a method of hot press processing.
Figure 14B:
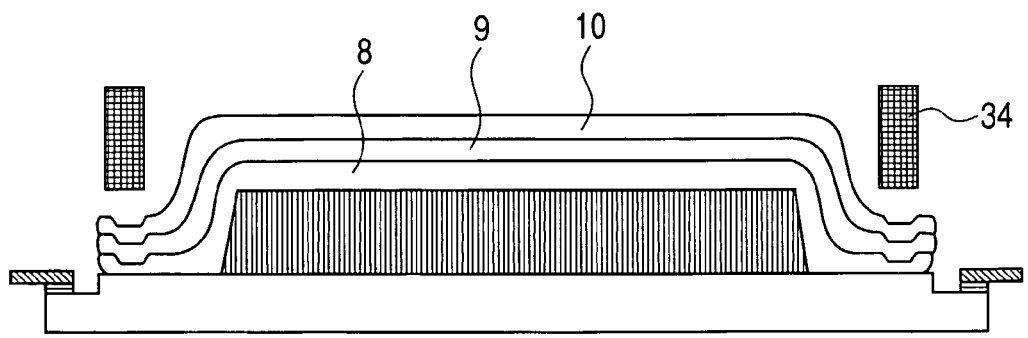

The hot press portion 14 is provided for improving the moisture resistance at the touching interface between the circumference region of the scintillator layer 7 of the scintillator protection layer 8, which consists of the hot-melt resin, and the sensor panel 16. In the present embodiment, the scintillator protection layer 8 consisting of the hot-melt resin touches the scintillator foundation layer 6 in the circumference portion of the scintillator layer 7. The hot press portion 14 can be formed in a part or in the whole of the circumference portion of the scintillator protection member. In the present embodiment, as shown in FIG. 1, the hot press portion 14 is formed in the whole circumference portion of the scintillator protection member. The hot press portion 14 is the region which is partially heated and pressurized to be press-bonded (adhering closely by being pressurized) so that the thickness of the hot-melt resin may become thinner than the other portions by the heating and pressurizing means 34 (shown in FIGS. 14A and 14B). As shown in FIGS. 14A and 14B, after performing the hot press processing of the scintillator protection layer 8 with the heating and pressuring means 34, the reflective layer 9 and the light reflection protection layer 10 are formed. Then, the hot press portion 14 is formed. The scintillator protection layer 8, the reflective layer 9 and the reflective layer protection layer 10 may collectively receive the hot press. A sectional view taken along a line 3A-3A viewed from an X direction in FIG. 2 is shown in FIG. 3A. A sectional view taken along a line 3B-3B viewed from the X direction in FIG. 2 is shown in FIG. 3B. Reference numerals 4a-4e denotes a wire pattern of the electronic connection portion 4. Asperities are produced on the surface of the sensor protection layer 5 in the surrounding region of the scintillator foundation layer 6 where the scintillator layer 7 is formed owing to the existence of the fetch wire 4. Although the scintillator foundation layer 6 functioning as a flattening layer is formed for softening the asperities, also the surface of the scintillator foundation layer 6 does not become completely flat to have some asperities. Even if the scintillator protection layer 8 consisting of the hot-melt resin is formed on such a surface, there is the possibility that some gaps 31 are generated as shown in FIG. 3B. That is, in the portion of FIG. 3B showing a cross section to which no hot press (heating and pressurizing) is performed, the penetration of the hot-melt resin to the unevenness of the wire pattern 4a-4e is insufficient, and there is a case where voids are produced between the wire pattern and the hot-melt resin. The gaps 31 may cause 1) the lowering of the adhesion force of the scintillator foundation layer 6 and the scintillator protection layer 8, 2) the deliquescence of the scintillator layer 7 by the moisture in the atmosphere which penetrates from the gaps 31, and 3) the lowering of the moisture resistance of the scintillator protection layer 8. Then, by performing the hot press processing (heating and pressuring) using the heating and pressurizing means 34 so as to surround the region where the scintillator layer 7 is formed in a region S where the scintillator foundation layer 6 and the scintillator protection layer 8 touch to each other, the hot-melt resin melted by heating enters the concave portions on the surface of the scintillator foundation layer 6 by pressurization, and is cured by cooling to adhere closely by filling up the gaps 31 on the scintillator foundation layer 6. That is, because the melting of the hot-melt resin is performed sufficiently in the portion of FIG. 3A showing the cross section to which the hot press processing has been performed, the generation of the gaps 31 is suppressed, and consequently the adhesion force is improved to improve the moisture resistance of the circumference portion. The hot press processing is performed, for example, for 1 to 60 seconds under the pressure within a range of from 1 to 10 kg/cm$^2$ at the temperature higher by 10 to 50° C. or more than the temperature of starting the melting of the hot-melt resin.

The scintillator protection layer 8 consisting of the hot-melt resin is described in detail below. In order to protect the scintillator layer, in particular in order to protect the scintillator layer 7 having the columnar crystal structure, the functions shown in the following items 1) to 12) are required for the scintillator protection layer 8.

1) Including shock resistance for preventing breakage due to a shock from outside the unit.

2) Including radiotransparency so as to transmit the radiation from a radiation source suitably.

3) Including optical transparency of suitably transmitting the light emitted from the scintillator layer 7.

4) Including a high adhesion property for adhesion with the scintillator layer, the sensor panel or the supporting member surface.

5) Including uniformity in the surface of the layer thickness to prevent the lowering of the resolution by optical path differences of transmitted light.

6) Including absorbency to absorb stress caused by the thermal expansion coefficient difference between the substrate and the reflective layer.

7) Including a film formation (forming) temperature which does not exert any harmful influences on the scintillator layer and photoreceiving layer.

8) Including a high film formation (forming) speed to promote high productivity.

9) Including a high moisture resistance (impermeability) to prevent the penetration of moisture from the outside air.

10) Not including any water, polar solvents, or other solvents and the like which might tend to dissolve the columnar crystal.

11) Including viscosity which does not cause an unacceptable lowering of the resolution by permeation into the columnar crystal.

12) Including a property of being insoluble or only slightly soluble in a solvent used for sterilization of medical appliances such as ethanol.

It is preferable to use the hot-melt resin as the material of the scintillator protection layer 8 satisfying the functions mentioned above. The hot-melt resin is defined as an adherent resin consisting of a 100% nonvolatile thermoplastic material which contains neither water nor a solvent and which is a solid at a room temperature (Thomas. P. Flanagan, *Adhesive Age* 9, No. 3, 28 (1996)). The hot-melt resin melts when the resin temperature rises, and solidifies when the resin temperature lowers. Moreover, the hot-melt resin has adhesion to other organic materials and inorganic materials in the state of being heated to be melted, and becomes in a solid state at an ordinary temperature not to have any adhesion. Moreover, because the hot-melt resin does not contain any polar solvent, any solvent and any water, the hot-melt resin does not dissolve the scintillator layer even if the hot-melt resin touches the deliquescent scintillator layer having (for example, a scintillator layer having the columnar crystal structure consisting of alkali halide). Consequently, the hot-melt resin can be used as the scintillator protection layer. The hot-melt resin differs from a solvent volatilization curing type adhesive resin formed by melting a thermoplastic resin to a solvent to be coated by a solvent coating method. Moreover, the hot-melt resin also differs from a chemical reaction type adhesive resin formed by a chemical reaction represented by epoxy and the like.

The hot-melt resin materials are classified according to the kinds of base polymers (base materials) which are the principal members, and polyolefin series, polyester series, polyamide series and the like can be used. As described above, as the scintillator protection layer 8, it is important that the moisture resistance is high and the optical transparency concerning the transmission of visible light rays generated from the scintillator is high. Polyolefin series resin and polyester series resin are preferable as the hot-melt resin satisfying the moisture resistance required as the scintillator protection layer 8. In particular, a polyolefin resin, which has a low coefficient of moisture absorption, is preferable. Moreover, a polyolefin series resin is preferable as a resin having high optical transparency. Therefore, the hot-melt resin using the polyolefin series resin as the base is more preferable as the scintillator protection layer 8.

Incidentally, as mentioned above, it is preferable to perform a heat seal (heating and pressurizing adhesion) in the region surrounding the scintillator layer 7 where the scintillator foundation layer 6 and the scintillator protection layer 8 touch each other by the hot press processing. Also with such an object, the hot-melt resin such as the polyolefin series, the polyester series and polyamide series, which has a property of melting to adhere to an adherend when temperature rises and of solidifying when the resin temperature is cooled, is suitably used.

The formation temperature of the scintillator protection layer 8 is required to be a temperature which does not exert a harmful influence on the scintillator layer 7, or the photoelectric conversion elements 2, the wires 3 and the TFTs (not shown), which are the photoreceiving layer 15. The formation temperature of the hot-melt resin used for the scintillator protection layer 8 depends on the temperature of starting melting of the resin. The temperature of starting melting of the hot-melt resin used for the scintillator protection layer 8 is preferably between 70° C. or more and 150° C. or less. When the temperature is lower than 70° C., the preservation durability of a product becomes inferior. When the temperature exceeds 150° C., a temperature exceeding 150° C. becomes necessary as the temperature of pasting together to the surface of the scintillator layer 7, and the thermal expansion difference between the substrate 1 consisting of glass or the like and the scintillator protection layer 8 consisting of the hot-melt resin. Consequently, when the scintillator protection layer 8 is formed on the substrate 1, the warp of the substrate 1 becomes large, which is not preferable. Much plasticizing material becomes necessary for forming the polyester series resins at a temperature range of from 70° C. to 150° C. to have the viscosity of melted hot-melt resin enabling the adherence processing. There is the possibility that the plasticizing material diffuses into the scintillator layer 7 and leads to the deterioration and the like of the scintillator layer 7. Consequently, when the suitable range of the temperature of starting melting of the hot-melt resin is taken into consideration, the polyolefin series resin material, which does not need the use of much plasticizing material, is more preferable.

The permeation of the scintillator protection layer 8 consisting of the hot-melt resin into the columnar crystal of the scintillator layer 7 having the columnar crystal structure depends on the viscosity coefficient (viscosity of melted hot-melt resin) at the time of the melting of the hot-melt resin. The viscosity coefficient at the time of melting, which is acquired with regard to the permeation, is preferably $1.5 \times 10^3$ Pa·s or more at the temperature range of from 100° C. to 140° C., which is the formation temperature of the scintillator protection layer 8 consisting of the hot-melt resin. It is more preferable that the viscosity coefficient is $1.5 \times 10^3$ Pa·s or more. When the viscosity coefficient at the time of melting is less than $1 \times 10^3$ Pa·s, the hot-melt resin permeates into the columnar crystal of the scintillator layer 7, and the light converted in the scintillator layer 7 is scattered. Consequently, the resolution of the image detected by the photoreceiving layer 15 lowers.

The adhesion property of the scintillator protection layer 8 consisting of the hot-melt resin with the scintillator layer 7 and/or the scintillator foundation layer 6 depends on the viscosity coefficient at the time of resin melting, the tensile strength of the resin. The viscosity coefficient acquired with regard to the adhesion property is preferably $1 \times 10^4$ Pa·s or less. The viscosity coefficient is more preferably $6.0 \times 10^3$ Pa·s or less. When the viscosity coefficient at the time of melting exceeds $1 \times 10^4$ Pa·s, the adhesion force needed to the scintillator layer 7 and the scintillator foundation layer 6 cannot be acquired. Consequently, the viscosity coefficient of the hot-melt resin used for the scintillator protection layer 8 of the present invention is preferably within a range of from $1 \times 10^3$ to $1 \times 10^4$ Pa·s at the temperature within a range of from 100° C. to 140° C. The viscosity coefficient is more preferably within a range of form $1.5 \times 10^3$ Pa·s to $6.0 \times 10^3$ Pa·s.

Moreover, the tensile strength required with regard to the adhesion property is preferably within a range of from 40 to 300 Kg/cm$^2$, more preferably within a range of from 50 to 200 Kg/cm$^2$. When the tensile strength is less than 40 Kg/cm$^2$, there is the possibility that the intensity required as the scintillator protection layer 8 is insufficient. Moreover, when the tensile strength exceeds 300 Kg/cm$^2$, there is a possibility that the interlayer exfoliation between the scintillator protection layer 8 and the scintillator layer 7, or the interlayer exfoliation between the scintillator layer 7 and the scintillator foundation layer 6, which are caused by the thermal expansion difference between the substrate 1 and the scintillator protection layer 8, cannot be prevented. Moreover, the interlayer exfoliation depends on also a breakage elongation percentage besides the tensile strength. The breakage elongation percentage of the hot-melt resin used for the scintillator protection layer 8 of the present invention is preferably within a range of from 400% or more, more preferably within a range of from 600% to 1000%.

The viscosity coefficient at the time of melting, the adhesion force owing to the tensile strength and the breakage elongation percentage, and the temperature of starting melting, which are required for the hot-melt resin used for the scintillator protection layer 8 in the present invention, can be controlled by changing the following elements individually or as a combination of two or more elements:

(1) the contents of the copolymers contained in hot-melt resin, (2) the contents of acrylic acid, acrylic ester, methacrylic acid and methacrylic acid ester in the copolymers contained in the hot-melt resin, and (3) the content of the additives contained in the hot-melt resin. The copolymers contained in the hot-melt resin and the materials constituting the various copolymers are described below.

The polyolefin series hot-melt resin used suitably for the scintillator protection layer 8 in the present invention preferably contains as the principal component at least one kind of a copolymer selected from the group consisting of: A. ethylene-vinyl acetate copolymer, B. ethylene-acrylic acid copolymer, C. ethylene-acrylic ester copolymer, D. ethylene-methacrylic acid copolymer, E. ethylene-methacrylic acid ester copolymer, and an ionomer resin copolymer.

Below, the five copolymers A-E mentioned above are described.

A. The ethylene-vinyl acetate copolymer is a copolymer of a material having a molecular structure composed of an ethylene unit; —CH$_2$—CH$_2$—, and a vinyl acetate; —CH$_2$—CH(OCOCH$_3$)—, and the general formula of the copolymer is shown by —[(CH$_2$—CH$_2$)$_a$—CH$_2$—CH(OCOCH$_3$)$_b$—]$_n$ (a, b, and n severally denote an integer). The content of the vinyl acetate to ethylene is preferably within a range of from 2% to 40% by weight. It is preferable to make the content of the vinyl acetate low, for making the moisture resistance of the hot-melt resin high. Moreover, in order to make adhesive force with the scintillator high, it is preferable to make the content of the vinyl acetate high. In the hot-melt resin used for the scintillator protection layer 8 in the present invention, it is preferable that the content of the ethylene-vinyl acetate copolymer is within a range of from 5% to 20%.

B. The ethylene-acrylic acid copolymer (EAA) is a copolymer of a material having a molecular structure composed of an ethylene unit; —CH$_2$—CH$_2$—, and an acrylic acid having a structure containing a carboxyl group randomly in the structure of polyethylene; —CH$_2$—CHCOOH—. The general formula is shown by —[(CH$_2$—CH$_2$)$_a$—(CH$_2$—CHCOOH)$_b$—]$_n$ (a, b and n severally denote an integer). The content of the acrylic acid to ethylene is preferably within a range of from 4% to 20% by weight. Similarly to the vinyl acetate mentioned above, it is preferable to make the content of the acrylic acid low, for making the moisture resistance of the hot-melt resin high. Moreover, in order to make the adhesion force with the scintillator layer high, it is preferable to make the content of the acrylic acid high. In the hot-melt resin used for the scintillator protection layer 8 in the present invention, the content of the ethylene-acrylic acid copolymer is preferably within a range of from 5% to 20%.

C. The ethylene-acrylic ester copolymer is a copolymer of a material having a molecular structure composed of an ethylene unit; —CH$_2$—CH$_2$—, and an acrylic ester; —CH$_2$—CHCOOR—. The general formula of the copolymer is shown by —[(CH$_2$—CH$_2$)$_a$—(CH$_2$—CHCOOR)$_b$—]$_n$ (a, b and n severally denote an integer) (wherein R is any one of CH$_3$, C$_2$H$_5$ and C$_3$H$_7$). The content of the acrylic ester to ethylene is preferably within a range of from 2% to 35% by weight. Similarly to the above, it is preferable to make the content of acrylic ester low, for making the moisture resistance of the hot-melt resin high. Moreover, in order to make the adhesion force with the scintillator layer high, it is preferable to make the content of the acrylic ester high. In the hot-melt resin used for the scintillator protection layer 8 in the present invention, the content of the ethylene-acrylic ester copolymer is preferably within a range of from 8% to 25%.

D. The ethylene-methacrylic acid copolymer is a copolymer of a material having a molecular structure composed of an ethylene unit; —CH$_2$—CH$_2$—, and the methacrylic acid having a structure randomly containing a carboxyl group in the structure of polyethylene; —CH$_2$—CCH$_3$COOH—. The general formula of the copolymer is shown by —[(CH$_2$—CH$_2$)$_a$—(CH$_2$—CCH$_3$COOH)$_b$—]$_n$ (a, b and n severally denote an integer). The content of the methacrylic acid to ethylene is preferably within a range of from 2% to 20% by weight. Similarly to the above, it is preferable to make the content of the methacrylic acid low, for making the moisture resistance rate of the hot-melt resin high. Moreover, in order to make the adhesion force with the scintillator layer high, it is preferable to make the content of the methacrylic acid high. In the hot-melt resin used for the scintillator protection layer 8 in the present invention, the content of the ethylene-methacrylic acid copolymer is preferably within a range of from 5% to 15%.

E. The ethylene-methacrylic acid ester copolymer is a copolymer of a material having a molecular structure composed of an ethylene unit; —CH$_2$—CH$_2$—, and a methacrylic acid ester; —CH$_2$—CCH$_3$COOR—. The general formula is shown by —[(CH$_2$—CH$_2$)$_a$—(CH$_2$—CCH$_3$COOR)$_b$—]$_n$ (a, b and n severally denote an integer). The content of the methacrylic acid ester to the ethylene is preferably within a range of from 2% to 25% by weight. Similarly to the above, it is preferable to make the content of the methacrylic acid ester low, for making the moisture resistance rate of the hot-melt resin high. Moreover, in order to make the adhesion force with the scintillator layer high, it is preferable to make the content of the methacrylic acid ester high. In the hot-melt resin used for the scintillator protection layer 8 in the present invention, the content of the ethylene-methacrylic acid ester copolymer is preferably within a range of from 3% to 15%.

The hot-melt resin used for the scintillator protection layer 8 of the present invention contains at least one kind of the five above-mentioned kinds of copolymers, and two or more kinds of mixtures may be made to be contained in the hot-melt resin. Moreover, in the hot-melt resin used for the scintillator protection layer 8 of the present invention, a mixture of two or more different copolymers of the same kind copolymers, for example, ethylene-methacrylic acid methyl copolymer and an ethylene-methacrylic acid ethyl copolymer, may be contained in the hot-melt resin. Moreover, in the hot-melt resin of the present invention, the weight-average molecular weight of the copolymers contained in the hot-melt resin is preferably within a range of from about 5,000 to about 1,000,000.

Moreover, as an additive added to the hot-melt resin, for example, a tackifier and a softener can be cited. As the tackifier, natural resins such as rosin, polymerized rosin, hydrogenated rosin and rosin ester, their denaturants, an aliphatic compound, an alicyclic compound, aromatic series, petroleum resin, terpene resin, terpene phenol resin, hydrogenated terpene resin, coumarone resin and the like can be cited. Moreover, as the softener, for example, process oil, paraffin oil, castor oil, polybutene, low molecular weight polyisoprene and the like can be cited.

The hot-melt resin used for the scintillator protection layer 8 of the radiation detecting apparatus (in particular of a radiation detecting apparatus for radiographing a human body and an animal) is preferably a hot-melt resin which does not damage the functions of the scintillator protection layer 8 even when alcohol for disinfection is scattered on it. As the hot-melt resin insoluble or slightly soluble to ethyl alcohol, being an alcohol for disinfection, it is preferable that the content of additives such as a tackifier in the hot-melt resin is 20% or less. In particular, it is more preferable that the content is 10% or less. Ethanol is a solvent used in hospitals, which are of course an environment where radiation detecting apparatuses are used, and may come into contact with the radiation detecting apparatus. The inventor found that, when the dissolved component to the solvent was 20% or less, exfoliation caused by the dissolution of the scintillator protection layer 8 did not occur. Moreover, in order to improve the adhesion force of the scintillator protection layer 8 consisting of the hot-melt resin with the scintillator layer 7 having the columnar crystal structure, the adhesion force can be improved by performing the previous surface modification of the surface touching the scintillator layer 7 of the scintillator protection layer 8 consisting of the hot-melt resin to make the critical surface tension of the surface $40 \times 10^{-3}$ J/m$^2$ or more, more preferably $45 \times 10^{-3}$ J/m$^2$ or more. When the contents of the copolymer such as acrylic acid, acrylic ester, methacrylic acid and methacrylic acid ester are made to be 20 wt % or less as the composition of the hot-melt resin, the critical surface tension of the scintillator protection layer 8 consisting of the hot-melt resin becomes within a range of from 30 to $37 \times 10^{-3}$ J/m$^2$, and wettability to the surface of the scintillator layer 7 and the surface of the sensor panel 16 surrounding the surface of the scintillator layer 7 becomes worse. Consequently, although the adhesion property of the scintillator protection layer 8 and the scintillator layer 7 with the sensor panel 16 tends to lower a little, the adhesion force can be improved by modifying the surface of the hot-melt resin to improve the critical surface tension. Although the method of the surface modification is not specifically limited at this time, for example, corona discharge treatment, ozone treatment, alkali treatment, argon plasma treatment, oxygen plasma treatment and the like are suitably used. By performing corona discharge treatment using a corona discharge apparatus for both the surfaces of the scintillator protection layer 8 consisting of the hot-melt resin, the critical surface tension of the scintillator protection layer 8 can be improved. Incidentally, in the present invention, the measurement of the critical surface tension was performed in accordance of the method of JIS K-6768. Incidentally, the adhesion force acquired between the scintillator protection layers 8 and the sensor panels 16 in the present invention is preferably 0.1 kg/25 mm or more in 90° type exfoliation test.

There are the methods shown below, for example, as the method of forming the hot-melt resin on the surface of the scintillator layer as the scintillator protection layer.

(1) A method of forming the hot-melt resin by melting the hot-melt resin to coat the melted resin directly on the surface of the scintillator layer 7 using a coating apparatus (which will be described with reference to FIGS. 4A, 4B and 4C).

(2) A method of forming a scintillator protection sheet by coating the hot-melt resin on a sheet in which the reflective layer 9 and the reflective layer protection layer 10 are laminated, and of forming the scintillator protection sheet on the surface of the scintillator layer 7 by heat press or heat lamination (which will be described with reference to FIGS. 5A, 5B, 6A and 6B).

(3) A method of forming a hot-melt resin sheet by creating a hot-melt resin on a exfoliation substrate to form the side of the hot-melt resin layer as the scintillator surface by means of heat press, heat lamination or the like, and of peeling off the exfoliation substrate.

(4) A method of creating a scintillator protection sheet, and of performing press bonding of the scintillator protection sheet with a vacuum pressing apparatus to form the hot-melt resin on the scintillator surface (which will be described with reference to FIGS. 7 and 8).

Figure 4A:
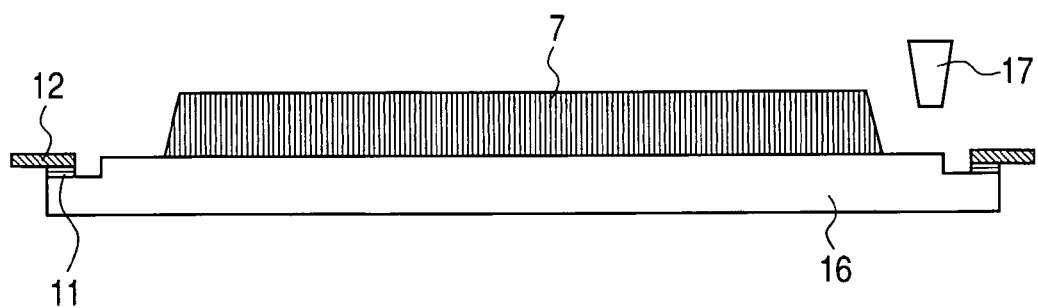
FIGS. 4A, 4B and 4C are views for illustrating a first method of forming a scintillator protection layer consisting of a hot-melt resin to a scintillator layer.
Figure 4B:
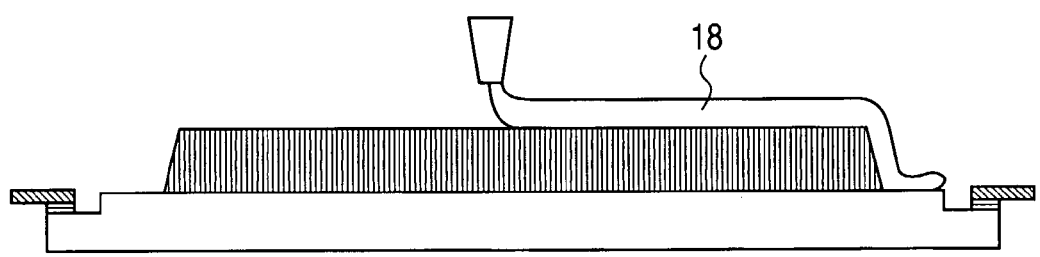
Figure 4C:
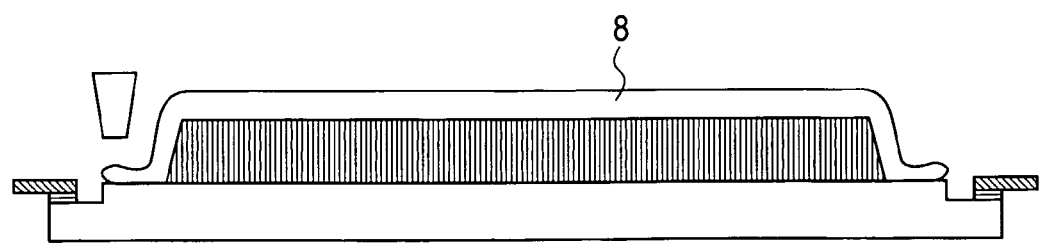

FIGS. 4A, 4B and 4C show the method of the above item (1). Melted hot-melt resin is directly coated on the scintillator layer 7 having the columnar crystal structure using a dye coater or a hot melt applicator. Then, the scintillator protection layer 8 can be obtained by performing the heat dissipation and curing the coated hot-melt resin. The scintillator protection layer 8 can be formed as a film having a thickness of 20 µm or more in a forming time of several seconds to several minutes. The method of the item (1) is concretely described with reference to FIGS. 4A, 4B and 4C. As shown in FIG. 4A first, a melted hot-melt resin 18 is prepared in a tank (not shown) and a dye coater 17, and the melted hot-melt resin 18 is located at a predetermined position on the scintillator foundation layer 6 (not shown) of the sensor panel 16. Next, as shown in FIG. 4B, the melted hot-melt resin 18 is ejected from the predetermined position of the scintillator foundation layer 6 while the hot-melt resin 18 is coated on the end face and the top face of the scintillator layer 7 by making the dye coater 17 scan the scintillator layer 7. Next, as shown in FIG. 4C, on the scintillator layer 7 and the surrounding scintillator foundation layer 6, the hot-melt resin is applied to form a coat, and heat dissipation and curing of the coated hot-melt resin is performed. Then, the method of item (1) ends.

Figure 5A:
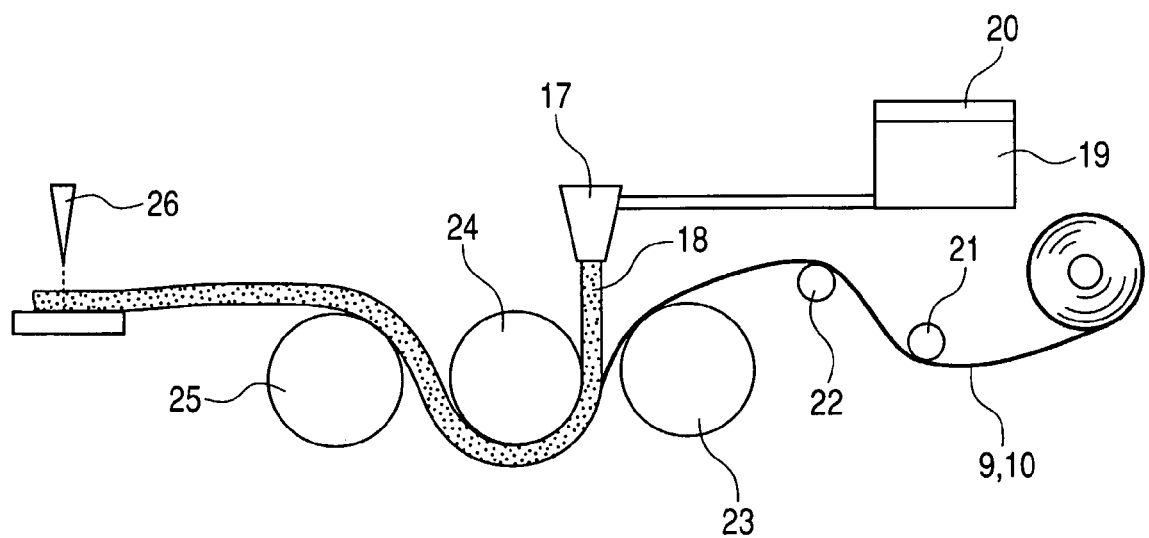
FIGS. 5A and 5B are other views for illustrating the first method of forming the scintillator protection layer consisting of the hot-melt resin.
Figure 5B:
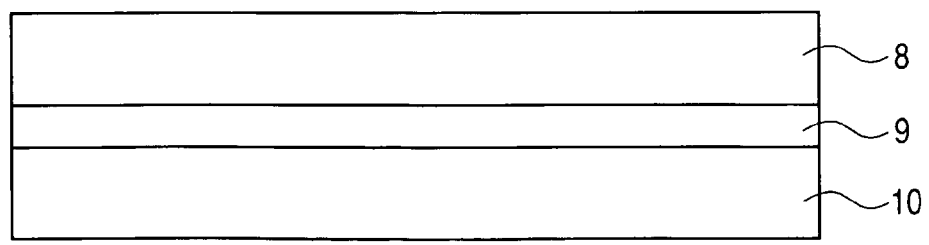
Figure 6A:
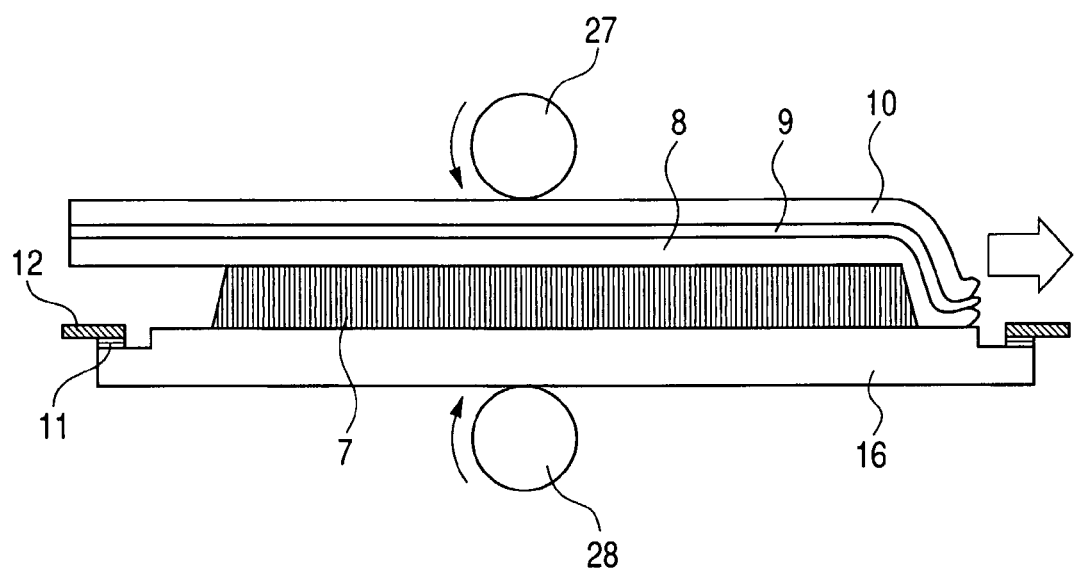
FIGS. 6A and 6B are views for illustrating a second method of forming a scintillator protection layer consisting of a hot-melt resin on the surface of a scintillator layer.
Figure 6B:
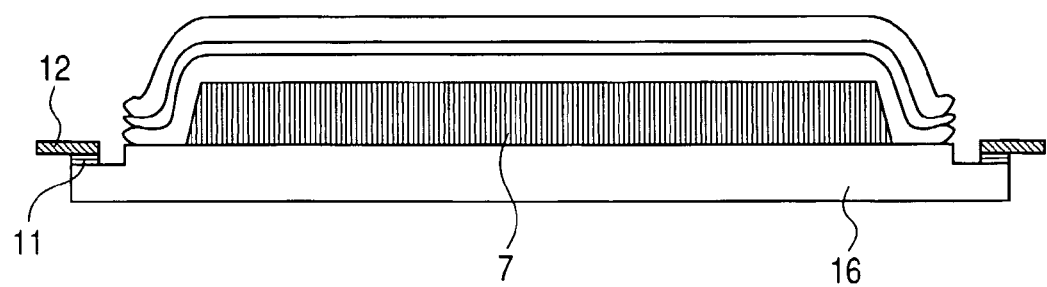

FIGS. 5A, 5B, 6A and 6B show the method of item (2). The method described here is the method of creating a scintillator protection sheet and forming the sheet on the surface of the scintillator layer 7 by heat lamination. The melted hot-melt resin is ejected onto the reflective layer protection layer 10 and the reflective layer 9 by the extrusion coating method, and the scintillator protection sheet in a laminated structure of the scintillator protection layer 8, the reflective layer 9 and the reflective layer protection layer 10 is formed. By laying the surface of the scintillator protection layer 8 side of the scintillator protection sheet on the scintillator layer 7 to perform the heat roll lamination, the scintillator protection layer 8 is formed on the scintillator layer 7. As shown in FIGS. 5A and 5B, a melted hot-melt resin is prepared in a tank 20 and the dye coater 17, and a laminated sheet composed of a lamination of the reflective layer 9 and the reflective layer protection layer 10, which is prepared in a rolled state and is made of a metal foil, a metal evaporated film or the like. Then, the wrinkles of the laminated sheet are smoothed by the wrinkle-buster rolls 21 and 22, and the melted hot-melt resin is ejected on the laminated sheet between forming rolls 23 and 24. Then, the scintillator protection layer 8 consisting of the hot-melt resin is coated on the laminated sheet by the extrusion coating method. After forming by the forming roll 24, the protection layer 8 is cooled and cured by the cooling roll 25, and the protection layer is cut out to a predetermined size by cutting means 26. Thus, the scintillator protection layer 8 consisting of the hot-melt resin is formed on the metal foil or the metal evaporated film 9, and the scintillator protection sheet shown in FIG. 5B is formed. Next, as shown in FIG. 6A, the obtained scintillator protection sheet is laid on the scintillator foundation layer 6 of the sensor panel 16, and the hot-melt resin is heated to a melting temperature of the hot-melt resin by a heat lamination roller 27 and to be melted. Then, the radiation detecting apparatus is moved by the heat lamination roller 27 and a conveyance roller 28 so that the heat lamination roller 27 may be relatively moved on the scintillator layer 7 from a predetermined starting position on the scintillator protection sheet on the scintillator foundation layer 6 to an opposed position with the scintillator layer 7 put between the predetermined starting position and the opposed position to perform heating and press bonding. Here, the radiation detecting apparatus is rotated on the plane by 90°, and the heat lamination roller 27 is relatively moved again on the scintillator layer 7 from the predetermined starting position on the scintillator protection sheet on the scintillator foundation layer 6, and the heating and press bonding is performed from the predetermined starting position to the opposed position with the scintillator layer 7 put between the starting position and the opposed position. In this way, as shown in FIG. 6B, the scintillator protection sheet 8 is adhered closely to the scintillator layer 7 and the scintillator foundation layer 6 of the sensor panel 16. The temperatures of the heat lamination rolls are adjusted in a range of from 90 to 180° C. The rotation speeds of the heat lamination rolls are adjusted in a range of from 0.01 to 1 m/min. The suppress strengths of the heat lamination rolls are adjusted in a range of from 1 to 50 kg/cm$^2$. The temperatures of the two heat lamination rolls 27 and 28 may differ mutually. By changing the temperatures, it is possible to decrease the generation of the warp of the glass substrate 1 of the radiation detecting apparatus after the heat lamination. Moreover, in place of the heat lamination, a supporting substrate is used, and the heating and press bonding may be performed only with the heat lamination roll 27. In order to improve the adhesion property of the scintillator protection layer 8 and the surface of the sensor panel 16 in the step portion produced in the portion in which the scintillator layer exists and the portion in which the scintillator does not exist, it is preferable to perform the two times of heat roll laminations as mentioned above. In the first heat roll lamination, the step portions on the side of opposing two sides of one of two pairs of sides of the radiation detecting apparatus being a quadrilateral are pushed by the heat lamination rolls 27 and 28, and becomes possible to adhere the scintillator protection layer 8 and the sensor panel 16 closely.

Next, by rotating the radiation detecting apparatus on the plane by 90°, and by performing the heat roll lamination again, it becomes possible to fully make the scintillator protection layer 8 and the sensor panel 16 adhere closely in the step portions on the other opposing two sides of the radiation detecting apparatus.

Next, the method of item (3) is described. This method forms a hot-melt resin sheet composed of a scintillator protection layer 8 and an exfoliation substrate by ejecting the melted hot-melt resin on the exfoliation substrate capable of being exfoliated by the extrusion coating method, and forms the side of the hot-melt resin layer to the scintillator protection layer 8 to the surface of the scintillator layer 7 by heat press, heat lamination or the like to peel off the exfoliation substrate after that. In the method of item (3), the process of forming the scintillator protection layer 8 on the scintillator layer 7 and the sensor panel 16 uses the exfoliation substrate instead of the laminated sheet consisting of the lamination of the reflective layer 9 and the reflective layer protection layer 10 of the method of the item (2). After the scintillator protection layer 8 is adhered closely on the surface of the scintillator layer 7 and the sensor panel 16 by being heated and melted with the heat lamination rolls 27 and 28, the exfoliation substrate is exfoliated from the scintillator protection layer 8 before the scintillator protection layer 8 is cooled to solidify. After the exfoliation substrate is exfoliated, by providing the laminated sheet consisting of the lamination of the reflective layer 9 and the reflective layer protection layer 10 on the scintillator protection layer 8, the scintillator protection member is formed, and the radiation detecting apparatus is completed.

Figure 7:
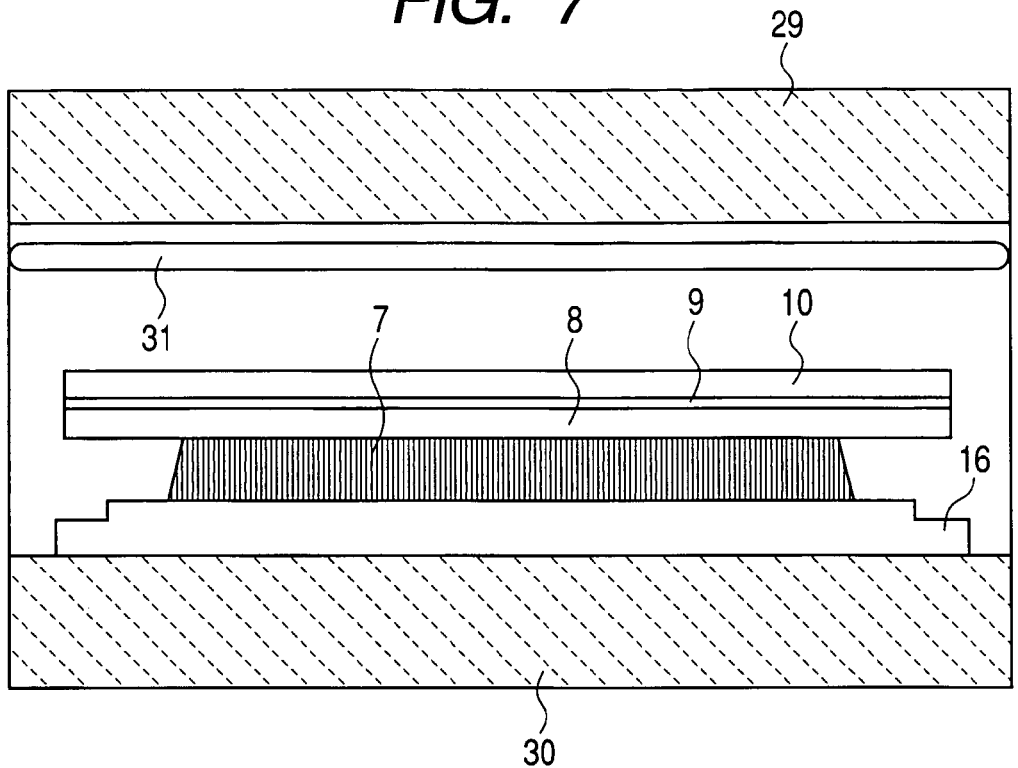
FIG. 7 is a view for illustrating a third method of forming a scintillator protection layer consisting of a hot-melt resin on the surface of a scintillator layer.
Figure 8:
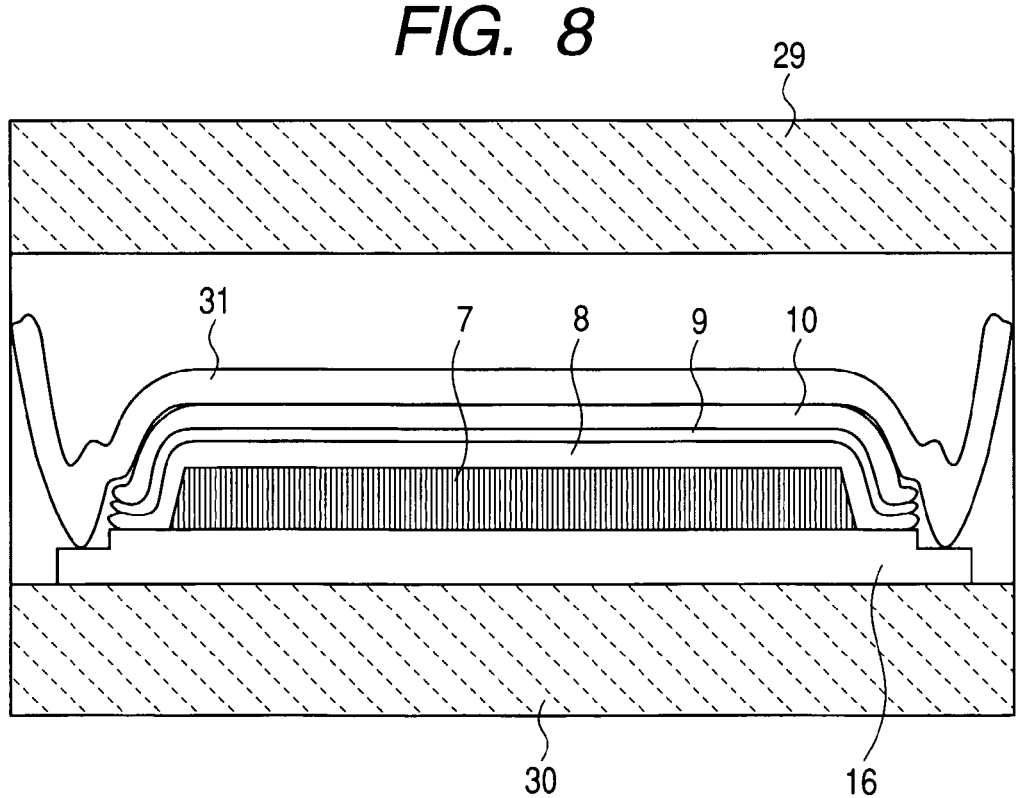
FIG. 8 is another view for illustrating the third method of forming the scintillator protection layer consisting of the hot-melt resin on the surface of the scintillator layer.

The method of item (4) is shown in FIGS. 7 and 8. FIGS. 7 and 8 show a film forming method of the scintillator protection film by the vacuum press system. The method ejects the hot-melt resin melted onto the reflective layer protection layer 10 and the reflective layer 9 by the extrusion coating method, forms the scintillator protection sheet consisting of the scintillator protection layer 8, the reflective layer 9 and the reflective layer protection layer 10, and lays the surface of the scintillator protection sheet on the side of the scintillator protection layer 8 on the scintillator layer 7 to perform the press bonding of the scintillator protection sheet with the vacuum pressing apparatus. As shown in FIG. 7, the sensor panel 16 on which the scintillator layer 7 is formed is arranged on a heating stage 30 in the vacuum pressing apparatus, and the scintillator protection sheet (the scintillator protection sheet shown in FIG. 5B) is arranged on the scintillator layer 7. Next, as shown in FIG. 8, the space of a press member 31 (such as a diaphragm rubber) on the side on which the radiation detecting apparatus is arranged is depressurized, and the space of the press member 31 on the opposite side to the side on which the radiation detecting apparatus is arranged is pressurized. Then, heating is performed from the side of the sensor panel 16 on the heating stage 30, and the inside of the vacuum pressing apparatus is heated by a heater 29. The scintillator protection layer 8 is pressurized by the diaphragm rubber so as to adhere closely to the surface of the scintillator layer 7 and the surface of the sensor panel 16 without any gaps, and the hot-melt resin is melted by heated for several seconds to several minutes at a temperature higher than the temperature of starting melting of the hot-melt resin by about 10 to about 60° C. The pressurization pressure is adjusted in a range of from 1 to 50 kg/cm$^2$. In this way, the hot-melt resin is melted and is pressed to be bonded. Then, heating is stopped, and the radiation detecting apparatus is cooled by heat dissipation. After that, the depressurization of the space in which the radiation detecting apparatus is arranged and the pressurization of the space on the opposite side of the space in which the radiation detecting apparatus is arranged are stopped. Then, the radiation detecting apparatus is taken out of the inside of the vacuum pressing apparatus. As a result, the radiation detecting apparatus (FIG. 8) in which the scintillator protection layer 8 are sufficiently adhered closely on the surface of the scintillator layer 7 and the surface of the sensor panel 16 is formed. Here, the hot-melt resin sheet mentioned above may be used instead of the scintillator protection sheet. In that case, similarly to the method of the item (3), before the scintillator protection layer 8 is cooled to solidify, the exfoliation substrate is exfoliated from the scintillator protection layer 8, and the laminated sheet is provided on the scintillator protection layer 8 after that. Thus, the radiation detecting apparatus is formed. The direct coating method of the method (1) mentioned above can form the scintillator protection layer having the equal thickness in a shorter time in comparison with the method of forming the organic film made of poly-para-xylylene by the conventional CVD method. Consequently, the direct coating method is superior in the easiness of manufacturing, cost and the film thickness uniformity. By method (2), (3) or (4), 1000 or more of the scintillator protection sheets or the hot-melt resin sheets can be collectively produced, that is, in a batch. It is possible to adhere the scintillator protection sheet or the hot-melt resin sheet on the scintillator layer 7 is for about 1 to about 30 minutes. Consequently, it becomes possible to form the scintillator protection layer 8 on the surface of the scintillator layer 7 and the surface of the sensor panel 16 at a film formation speed sufficiently faster than that of the conventional CVD method for forming the organic film made of poly-para-xylylene. The size of the scintillator protection sheet or the size of the hot-melt resin sheet can be set to a predetermined size, and the scintillator protection layer 8 can be formed without covering the wire member 12 such as the IC of the radiation detecting apparatus by adjusting the size of the scintillator protection sheet or the side of the hot-melt resin sheet. Consequently, the process of removing the scintillator protection layer of an electric mounting portion after the formation of the scintillator protection layer like the process of the organic film made of poly-para-xylylene formed by the CVD method is unnecessary.

Second Embodiment

Figure 9:
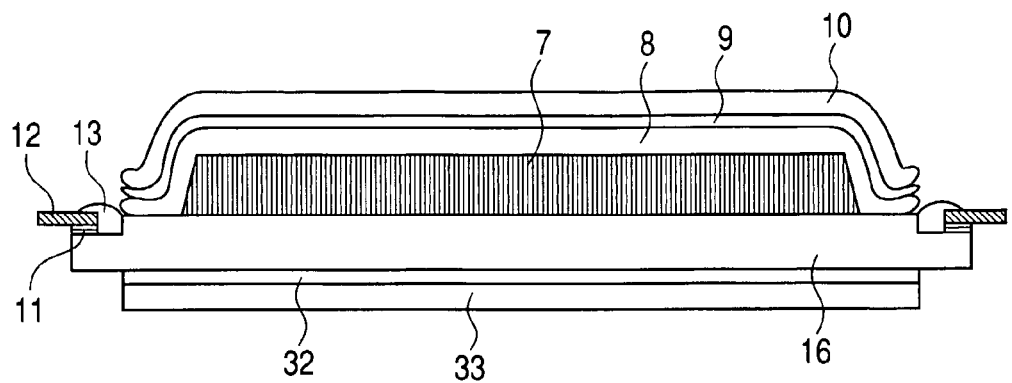
FIG. 9 is a sectional view of a radiation detecting apparatus according to a second embodiment of the present invention.

FIG. 9 is a schematic diagram showing a second embodiment of the present invention. In the present embodiment, as shown in FIG. 9, in addition to the first embodiment, a warp correction layer 33 is provided on the back surface of the sensor panel 16. If the scintillator protection layer 8 is formed on the sensor panel using heat treatment, a warp may occur on the sensor panel 16 owing to e differences of the thermal expansion and the thermal contraction between the sensor panel 16 and the scintillator protection layer 8, and difference of heat contraction. Moreover, if the thickness of the scintillator protection layer 8 becomes thicker than a fixed thickness (for example, 100 μm or more), a warp may occur in the substrates 1 such as glass on which the photoreceiving layer 15 of the radiation detecting apparatus is formed. The scintillator protection layer 8 consisting of the hot-melt resin is provided on the surface of the sensor panel 16 on which the scintillator layer 7 is formed at the temperature within a range of form 100 to 160° C., and after that the temperature returns to the room temperature. Then, the hot-melt resin solidifies to be formed. Therefore, the warp arises in the substrate 1 owing to the difference of the thermal expansion coefficients of the hot melt resin and the scintillator protection film and the thermal expansion coefficient of the substrate 1 in the temperature difference between the temperature at which the hot-melt resin is prepared and the temperature at the time of returning to the room temperature. In the case where the warp exists in the substrate 1, an alignment becomes difficult at the time of adhering the wire member 12 mounting the IC part such as TCP to the electronic connection portion 4 of the sensor panel 16 using the wire connecting portion 11 such as the anisotropic conductive adhesive. Accordingly, in the present embodiment, by forming the warp forcing layer 33 on the back surface of the sensor panel 16 with an adherence layer 32 between as shown in FIG. 9, the warp of the substrate 1 of the sensor panel 16 can be reduced. The quality of the material of the warp forcing layer 33 is preferably a material having the thermal expansion coefficient of the hot-melt resin when the cause of the warp exists in the hot-melt resin, or the material having the thermal expansion coefficient of the laminated sheet when the cause of the warp exists in the laminated sheet composed of the lamination of the reflective layer 9 and the reflective layer protection layer. The warp correction layer 33 may contain a coloring material such as black to have a light blocking function, and the warp correction layer 33 may be used as a light blocking layer. In that case, an organic pigment and an inorganic pigment can be preferably used as the coloring material. As the organic pigments, there are nitro series pigments, azo pigments, indanthrene, thioindigo perinone, perylene, dioxazine, quinacridone, phthalocyanine, isoindolinone and kinophthalone series. As the inorganic pigments, there are carbon black, chrome yellow, cadmium yellow, clover million (orange) colcothar, vermilion, red lead, cadmium red, mineral violet (purple), cobalt blue, cobalt green, chromic oxide, indium oxide, tin oxide, viridian (green) and the like.

Third Embodiment

Figure 10A:
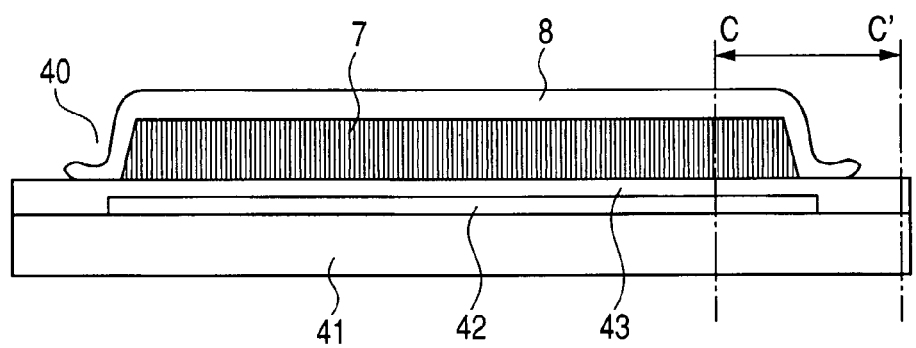
FIGS. 10A and 10B are the sectional views showing a scintillator panel of a radiation detecting apparatus according to a third embodiment of the present invention.
Figure 10B:
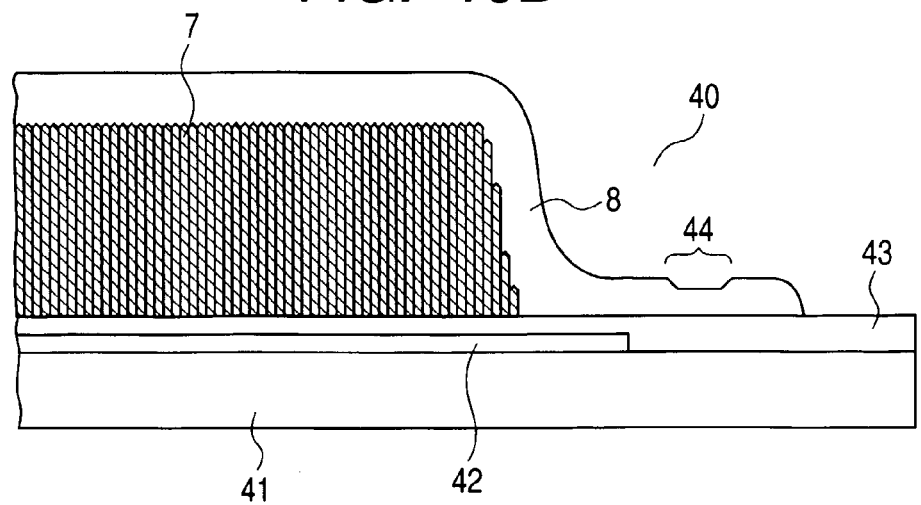
Figure 11A:
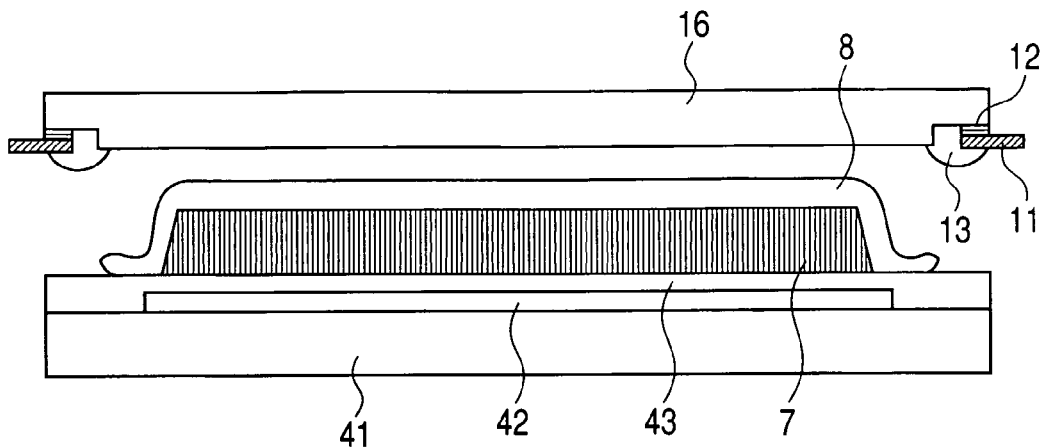
FIGS. 11A and 11B are sectional views showing the radiation detecting apparatus according to the third embodiment of the present invention and a manufacturing method of the radiation detecting apparatus.
Figure 11B:
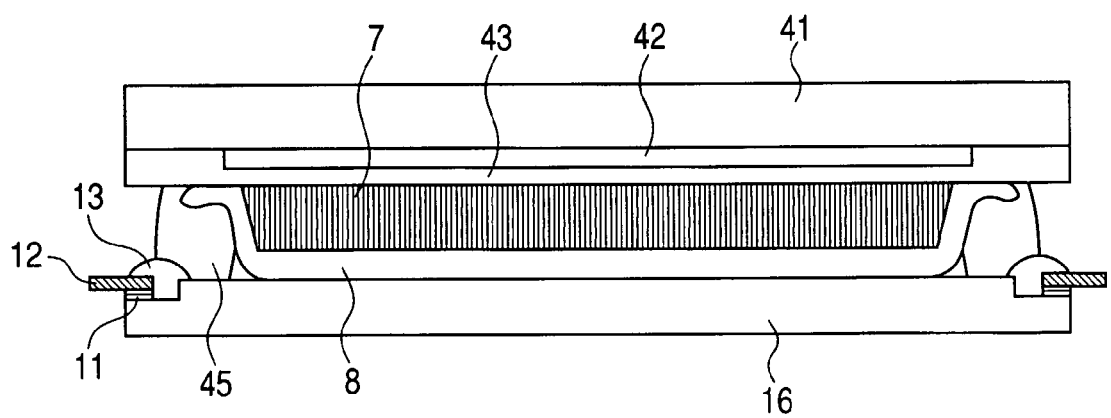
Figure 12:
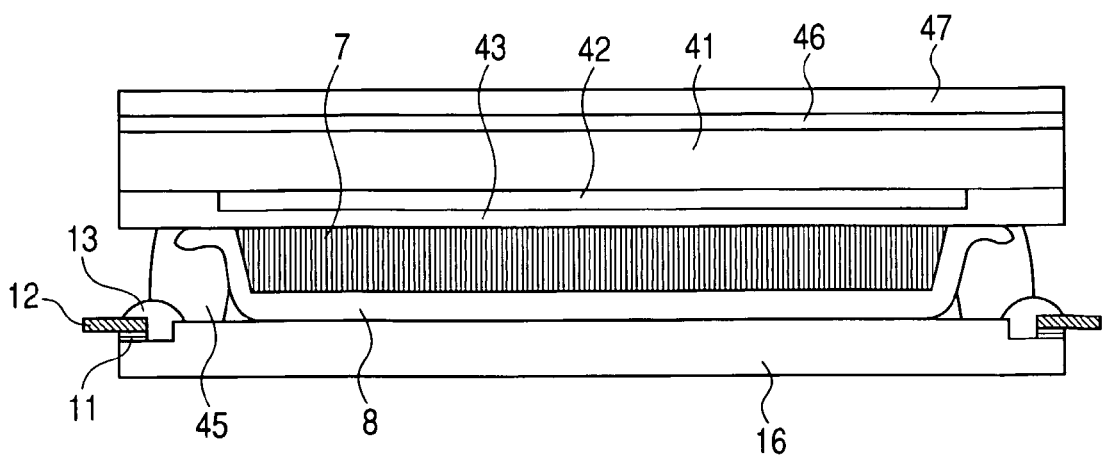
FIG. 12 is a sectional view showing another form of the radiation detecting apparatus according to the third embodiment of the present invention.

FIGS. 10A, 10B, 11A and 11B show another embodiment. The present embodiment shows a paste together type radiation detecting apparatus produced by pasting the sensor panel 16 and a scintillator panel 40 in which the hot-melt resin layer covers the scintillator layer. As shown in FIGS. 10A and 10B, the scintillator panel 40 is produced by forming a reflective layer 42, a reflective layer protection layer (scintillator foundation layer) 43, the scintillator layer 7 and the scintillator protection layer 8 on a supporting substrate 41. By being influenced by the supporting substrate 41 and the reflective layer 42, a step and the asperity or roughness accompanying the step exist on the surface of the reflective layer protection layer (scintillator foundation layer) 43 on the outside of the region in which the scintillator layer 7 is formed. The scintillator protection layer 8 consisting of a hot-melt resin melts and enters into the step and the asperity, and solidifies after that. Thereby, the scintillator protection layer 8 adheres closely to the surfaces of the scintillator layer 7 and the reflective layer protection layer (scintillator foundation layer) 43. Thus, the scintillator protection layer 8 is provided so as to cover the surface and the side faces of the scintillator layer 7 and a part of the surface of the reflective layer protection layer (scintillator foundation layer) 43. A hot press portion 44 is formed on the scintillator panel 40, and the hot press portion 44 is preferably provided on the outside of the region in which the reflective layer 42 is formed. The reason is that, when a hot press is performed in the region on the reflective layer 42, the reflective layer 42 is deformed owing to heat, and reflected light does not enter a predetermined pixel to cause the lowering of resolution. In the present embodiment, the same components as those of the first embodiment are shown by the same numbers, and their descriptions are omitted. Moreover, the scintillator protection layer 8 consisting of the hot-melt resin is formed by the same method except using the supporting member composed of the supporting substrate 41, the reflective layer 42 and the scintillator foundation layer 43 instead of the sensor panel 16. As the supporting substrate 41, it is preferable to use various substrates having radiotransparency such as an amorphous carbon board, an Al substrate, a glass substrate and a quartz substrate. It is preferable to use metals each having high reflectance such as Al, Ag, Cr, Cu, Ni, Ti, Mg, Rh, Pt and Au as the reflective layer 42. As the reflective layer protection layer (scintillator foundation layer) 43, it is preferable to use transparent inorganic films such as LiF, MgF$_2$, SiO$_2$, Al$_2$O$_3$, TiO$_2$, MgO and SiN, and transparent organic films such as polyimide. Moreover, as the reflective layer protection layer (scintillator foundation layer) 43, in order to prevent the generating of electrochemical corrosion between the reflective layer 42 and the scintillator layer 7, it is preferable to use non-conductive material. When a conductive material is used for the supporting substrate 41, in order to prevent the electrochemical corrosion between the supporting substrate 41 and the reflective layer 42, it is preferable to form an insulated layer between the supporting substrate 41 and the reflective layer 42. As shown in FIGS. 11A and 11B, such scintillator panel 40 and such sensor panel 16 are bonded together using the adhesion of the scintillator protection layer 8 consisting of the hot-melt resin. After the pasting, the periphery of the radiation detecting apparatus (the sensor panel 16 and the scintillator panel 40) adhered together with a sealing agent 45 is sealed. Here, the sensor panel 16 and the scintillator panel 40 may be bonded together using general adhesion material such as an epoxy resin separately in the adhesion. However, when the adhesion material is used separately, the distance from the scintillator layer 7 to the photoreceiving layer 15 becomes large, and there is the possibility that the lowering of the resolution by the scattering of the light emitted in the scintillator layer 7 may take place. FIG. 12 shows a case where a warp correction layer 47 is provided on the scintillator panel 40 in the past together type radiation detecting apparatus. The warp correction layer 47 is provided on the back surface of the scintillator panel (the surface on which the scintillator layer 7 and the scintillator protection layer 8 are formed and the surface of the opposite side) of the radiation detecting apparatus of the embodiment described with reference to FIGS. 10A, 10B, 11A and 11B with an adherence layer 46 between the back surface and the warp correction layer 47. Although there is the possibility that a warp is generated on the supporting substrate 41 owing to the differences of the thermal expansion and the thermal contradiction between the supporting substrate 41 and the scintillator protection layer 8, the warp correction layer 47 consisting of the resin having a thermal expansion coefficient almost equal to the hot-melt resin used for the scintillator protection layer 8 is formed on the back surface (the surface on which the scintillator protection layer 8 is formed, and the surface on the opposite side) of the substrate 41 with the adherence layer 46 put between the warp correction layer and the back surface.

Fourth Embodiment

Next, a radiation detecting system using a radiation detecting apparatus according to the present invention is described with reference to FIG. 13. As shown in FIG. 13, X-rays 6060 generated by the X-ray tube 6050 penetrate the breast 6062 of a patient or a subject 6061, and the transmitted X-rays 6060 enter a radiation detecting apparatus 6040. The information of the inside of the body of the patient 6061 is included in the entered X-ray. Correspondingly to the incidence of the X-rays, the scintillator of the radiation detecting apparatus 6040 emits light, and the light is photoelectrically converted. Thus, electric information can be acquired. This information is converted into digital information, and image processing is performed by the image processor 6070. Then, the processed image can be observed on the display 6080 in a control room.

Moreover, the information can be transmitted to a remote place by transmission means such as a telephone line 6090, and the information can be displayed or saved on a display 6081 in such as a doctor's room located somewhere else in storage means such as an optical disc. Also, a doctor at a remote place is able to make a diagnosis. Moreover, it is also recordable on a film 6110 with the film processor 6100.

Concrete examples are given in the following, and the present invention is described in detail.

EXAMPLE 1

The present example is an example of the direct deposition type radiation detecting apparatus shown in the first embodiment and FIG. 1.

In an region of 430 mm×430 mm on a glass substrate 1 having a thickness of 0.7 mm, a photoreceiving layer 15 was formed by arranging two-dimensionally pixels each having a pixel size of 160 μm×160 μm which pixel consisted of a photodiode (photoelectric conversion element) 2 made of amorphous silicon, a TFT (not shown) and an Al wire 3. Moreover, in the surrounding region of the glass substrate 1, an Al fetch wire 4 for the electrical connection with a wire member 12 such as an IC reading the photoelectric conversion information read from the photoreceiving layer 15, and a wire connecting portion 11 were formed. After that, a sensor protection layer 5 consisting of SiN and a scintillator foundation layer (passivation film) 6 consisting of polyimide were formed except for the region in which the wire connecting portion 11 was formed, and a sensor panel 16 was obtained.

On the scintillator foundation layer 6 on the photoreceiving layer 15 of the obtained sensor panel 16, CsI:Tl of a columnar crystal structure in which thallium (Tl) was added to cesium iodide (CsI) was formed to be 550 μm in thickness by the vacuum evaporation method in a film formation time of four hours. The addition concentration of Tl was within a range of from 0.1 to 0.3 mol %. The column diameter on the side of the top face of the columnar crystal of CsI:Tl (on the side of the surface of evaporation end) was about 5 μm in an average. A scintillator layer 7 was obtained by heat-treating the formed CsI:Tl within a clean oven under 200° C. nitrogen atmosphere for two hours.

Next, as shown in FIGS. 4A, 4B and 4C, a hot-melt resin containing ethylene-vinyl acetate copolymer as the principal member was melted at 160° C. The hot-melt resin having a thickness of 100 μm and covering the surface of the scintillator foundation layer 6 in the region surrounding the region in which the scintillator layer 7 was formed (the region between the end of the scintillator layer 7 and the end of the scintillator foundation layer 6), the side faces and the top face of the scintillator layer 7 was formed using dye coater 17. At room temperature, the heat of the formed hot-melt resin was dissipated, and the hot-melt resin was solidified. Thus, a scintillator protection layer 8 consisting of the hot-melt resin was obtained. In the present example, HIRODAIN 7544 (a product made by Hirodain Industries) was used as the hot-melt resin containing ethylene-vinyl acetate copolymer as the principal member.

Next, a laminated film in which a reflective layer 9 consisting of Al with a thickness of 40 μm and a reflective layer protection layer 10 consisting of polyethylene terephthalate (PET) with a thickness of 50 μm were laminated was prepared in the state in which the reflective layer 9 was faced to the scintillator protection layer 8 side. The film sheet was adhered to the scintillator protection layer 8 using the heat lamination roller 27 under the conditions in which the roller temperature of the heat lamination roller 27 was 120° C. and the rotation speed of the roll was 0.2 m/min, and a scintillator protection member consisting of the scintillator protection layer 8, the reflective layer 9 and the reflective layer protection layer 10 was obtained.

Next, the wire member 12 consisting of a tape career package (TCP) in which an IC was provided was bonded by pressure at 150° C. using an ACF (anisotropy adhesion material), and was connected to the wire connecting portion 11. Thus, the radiation detecting apparatus shown in FIG. 1 was obtained.

The radiation detecting apparatus produced as mentioned above was saved in a temperature and humidity test tub at 60° C. and 90% for 1000 hours. As a result, no defective appearances such as displacement of the scintillator layer 7 and exfoliation between each layer were produced. Moreover, deterioration of the light intensity of the scintillator layer 7 owing to corrosion and deliquescence caused by water or the solvent was not observed at all. Consequently, a radiation detecting apparatus of high reliability was obtained.

EXAMPLE 2

In the present example, the same radiation detecting apparatus as that of the example 1 was manufactured by the same method as that of the example 1 except for the usage of the hot-melt resin material and the formation method different from those used of the scintillator protection layer 8 of the example 1.

A scintillator layer 7 consisting of CsI:Tl of the columnar crystal structure was acquired by the same method as that of the example 1 on a scintillator foundation layer 6 on a photoreceiving layer 15 of a sensor panel 16 obtained by the same method as that of the example 1.

Next, as shown in FIGS. 5A and 5B, the hot-melt resin containing an ethylene-acrylic ester copolymer as the principal member is prepared by being melted at 120° C. in the tank 20. Moreover, a laminated sheet formed by lamination of an Al reflective layer 9 having a thickness of 25 μm and a PET reflective layer protection layer 10 having a thickness of 25 μm was prepared in a rolled state. The wrinkles of the laminated sheet were smoothed out by the wrinkle-buster rolls 21 and 22. On the smoothed laminated sheet, a hot-melt resin melted between the forming rolls 23 and 24 was coated by the extrusion coating method using the dye coater 17, and the hot-melt resin was formed with the forming roll 24. Then, the hot-melt resin was cooled to be cured with the cooling roll 25. After that, the laminated sheet was cut out to a predetermined size by cutting means, and a scintillator protection sheet having a laminated structure of the hot-melt resin with a thickness of 75 μm used as the scintillator protection layer 8, the reflective layer 9 and the reflective layer protection layer 10 was obtained. In the present example, O-4121 (made by Kurabo Industries) was used as the hot-melt resin containing the ethylene-acrylic ester copolymer as the principal member.

Next, as shown in FIGS. 6A and 6B, the acquired scintillator protection sheet was laid on the scintillator foundation layer 6 and the scintillator layer 7, and a hot-melt resin was processed by heating and press bonding with the heat lamination roller 27 so that the surface of the scintillator foundation layer 6 in the region surrounding the region in which the scintillator layer 7 was formed (the region between the end of the scintillator layer 7 and the end of the scintillator foundation layer 6), and the side faces and the top face of the scintillator layer 7 may be covered. The radiation detecting apparatus was moved using the heat lamination roller 27 and the conveyance roller 28 so that the heat lamination roller 27 might be relatively moved on the scintillator layer 7 from a predetermined start position on the scintillator protection sheet on the scintillator foundation layer 6, and the heating and press bonding was performed from the predetermined starting position to an opposed position with the scintillator layer 7 put between the starting position and the opposed position. Then, the radiation detecting apparatus was rotated on a plane by 90°, and the heat lamination roller 27 was relatively moved again on the scintillator layer 7 from the predetermined starting position on the scintillator protection sheet on the scintillator foundation layer 6, and the heating and press bonding was performed from the predetermined starting position to the opposed position with the scintillator layer 7 put between the starting position and the opposed position. By the heating and press bonding processing, the scintillator protection sheet 8 was adhered closely to the scintillator foundation layer 6, and the side faces and the top face of the scintillator layer 7. Thus, a scintillator protection member composed of the scintillator protection layer 8, the reflective layer 9 and the reflective layer protection layer 10 was obtained. Here, the heating and press bonding was performed under the conditions in which the roller temperature of the heat lamination roller 27 was set to 130° C., the roll rotation speed was set to 0.1 m/min, and the pressure was set to 10 kg/cm².

Next, a wire member 12 was connected to a wire connecting portion 11 by the same method as that of the example 1, and a radiation detecting apparatus shown in FIG. 1 was obtained.

The radiation detecting apparatus produced as mentioned above was saved in a temperature and humidity test tub at 60° C. and 90% for 1000 hours. As a result, defective appearances such as displacement of the scintillator layer 7 and exfoliation between each layer were not produced. Moreover, deterioration of the emitted light intensity by corrosion and deliquescence caused by water or a solvent of the scintillator layer 7 was not observed at all. Thus, the radiation detecting apparatus of high reliability was obtained.

EXAMPLE 3

In the present example, the same radiation detecting apparatus as the example 2 was manufactured by the same method as that of the example 2 except for having used a hot-melt resin material different from the hot-melt resin material used for the scintillator protection layer 8 of the example 2.

A scintillator layer 7 consisting of CsI:Tl of a columnar crystal structure was acquired by the same method as those of the examples 1 and 2 on the scintillator foundation layer 6 on the photoreceiving layer 15 of the sensor panel 16.

Next, a hot-melt resin containing an ethylene-methacrylic acid ester copolymer as the principal member was provided as the scintillator protection layer 8 on the laminated sheet by 100 μm in thickness by the same method as that of the example 2, and the scintillator protection sheet consisting of a laminated structure of the scintillator protection layer 8, a reflective layer 9 and a reflective layer protection layer 10 was obtained. In the present example, W-4110 (made by Kurabo Industries) was used as the hot-melt resin containing the ethylene-methacrylic acid ester copolymer as the principal member.

Next, by the heating and press bonding processing similar to that of the example 2, the scintillator protection layer 8 of the scintillator protection sheet was adhered closely to the scintillator foundation layer 6 and the side faces and the top face of the scintillator layer 7, and a scintillator protection member composed of the scintillator protection layer 8, the reflective layer 9 and the reflective layer protection member 10 was acquired. Here, the heating and press bonding was performed under the conditions in which the roller temperature of the heat lamination roller 27 was 120° C., the roll rotation speed was 0.1 m/min, and the pressure was 10 kg/cm$^2$.

Next, a wire member 12 was connected to a wire connecting portion 11 by the same method as those of the examples 1 and 2, and a radiation detecting apparatus shown in FIG. 1 was obtained.

The radiation detecting apparatus produced as mentioned above was saved in a temperature and humidity test tub at 60° C. and 90% for 1000 hours. As a result, defective appearances such as displacement of the scintillator layer 7 and exfoliation between each layer were not produced. Moreover, deterioration of the emitted light intensity by corrosion and deliquescence caused by water or a solvent of the scintillator layer 7 was not observed at all. Thus, the radiation detecting apparatus of high reliability was obtained.

EXAMPLE 4

In the present example, the same radiation detecting apparatus as that of the example 2 was manufactured by the same method as that of the example 2 except for the usage of a hot-melt resin material different from that of the scintillator protection layer 8 of the example 2 and the execution of the processing of the surface of the scintillator protection layer 8 of the scintillator protection sheet.

A scintillator layer 7 consisting of CsI:Tl of the columnar crystal structure was acquired by the same method as those of the examples 1 and 2 on a scintillator foundation layer 6 on a photoreceiving layer 15 of a sensor panel 16 acquired by the same method as those of the examples 1 and 2.

Next, a hot-melt resin containing an ethylene-acrylic ester copolymer as the principal member was provided as the scintillator protection layer 8 on the laminated sheet by 100 μm in thickness by the same method as that of the example 2, and the scintillator protection sheet consisting of a laminated structure of the scintillator protection layer 8, a reflective layer 9 and a reflective layer protection layer 10 was obtained. In the present example, H-2500 (made by Kurabo Industries) was used as the hot-melt resin containing the ethylene-acrylic ester copolymer as the principal member. H-2500 is a resin in which the content of the additives such as adhesion addition agent is 20% or less. H-2500 has a high chemical resistance. For example, when H-2500 is impregnated by ethyl alcohol, an antiseptic substance for medical use, for one hour, the weight change thereof was 5% or less. Next, the surface modification of the surface of the scintillator protection layer 8 of the acquired scintillator protection sheet was performed by the corona discharge treatment so that the surface energy might be 45×10$^{-3}$ J/m$^2$.

Next, by the heating and press bonding processing similar to that of the example 2, the scintillator protection layer 8 of the scintillator protection sheet, which had the modified surface, was adhered closely to the scintillator foundation layer 6 and the side faces and the top face of the scintillator layer 7, and the scintillator protection member composed of the scintillator protection layer 8, the reflective layer 9 and the reflective layer protection member 10 was acquired. Here, the heating and press bonding was performed under the conditions in which the roller temperature of the heat lamination roller 27 was 130° C., the roll rotation speed was 0.1 m/min, and the pressure was 10 kg/cm$^2$.

Next, a wire member 12 was connected to a wire connecting portion 11 by the same method as those of the examples 1 and 2, and a radiation detecting apparatus shown in FIG. 1 was obtained.

The radiation detecting apparatus produced as mentioned above was saved in a temperature and humidity test tub at 60° C. and 90% for 1000 hours. As a result, defective appearances such as a displacement of the scintillator layer 7 and exfoliation between each layer were not generated. Moreover, deterioration of the emitted light intensity by corrosion and deliquescence caused by water or a solvent of the scintillator layer 7 was not observed at all. Thus, the radiation detecting apparatus of high reliability was obtained.

Moreover, even if ethyl alcohol, which is an antiseptic substance for medical use, was scattered on the radiation detecting apparatus obtained according to the present example, no exfoliation of the scintillator protection layer occurred, but the radiation detecting apparatus having the scintillator protection layer having a high moisture resistance was obtained.

EXAMPLE 5

In the present example, the same radiation detecting apparatus as that of the example 4 was manufactured by the same method as that of the example 4 except for the execution of heating and press bonding treatment different from that of the scintillator protection sheet of the example 4 and the execution of heating and pressurizing of a predetermined region of the scintillator protection layer 8 adhered closely to the scintillator foundation layer 6.

A scintillator layer 7 consisting of CsI:Tl of the columnar crystal structure was acquired by the same method as those of the examples 1 and 2 on the scintillator foundation layer 6 on a photoreceiving layer 15 of a sensor panel 16 acquired by the same method as those of the examples 1 and 2.

Next, a hot-melt resin containing an ethylene-acrylic ester copolymer as the principal member was provided as the scintillator protection layer 8 on the laminated sheet by 100 μm in thickness by the same method as that of the example 2, and the scintillator protection sheet consisting of a laminated structure of the scintillator protection layer 8, a reflective layer 9 and a reflective layer protection layer 10 was obtained. In the present example, H-2500 (made by Kurabo Industries) was used as the hot-melt resin containing the ethylene-acrylic ester copolymer as the principal member similarly in the example 4.

Next, as shown in FIGS. 7 and 8, the acquired scintillator protection sheet was laid on the scintillator foundation layer 6 and the scintillator layer 7, and placed on the heating stage 30 in the vacuum pressing apparatus. A hot-melt resin was processed by the heating and press bonding processing with the press member 31 composed of the heating heater 29, the heating stage 30 and the diaphragm rubber so as to cover the surface of the scintillator foundation layer 6 in the region surrounding the region in which the scintillator layer 7 was provided (the region between the end of the scintillator layer 7 and the end of the scintillator foundation layer 6), and the side faces and the top face of the scintillator layer 7. In the heating and press bonding treatment, first a radiation detecting apparatus acquired by laying the scintillator protection sheet on the scintillator layer 7 was placed on the heating sage 30 in the vacuum pressing apparatus. Next, the space of the press member 31 on the side on which the radiation detecting apparatus was arranged was depressurized, and at the same time the space of the press member 31 on the opposite side to the side on which the radiation detecting apparatus was arranged was pressurized. Moreover, heating was performed from the sensor panel side with the heating stage 30, and the inside of the vacuum pressing apparatus was heated with the heater 29. Thereby, the hot-melt resin was melted to be press-bonded. Here, the heating and press bonding treatment was performed under the conditions in which the temperatures of the heating heater 29 and the heating stage 30 of the vacuum pressing apparatus were set to 130° C., the pressurizing time was set to one minute, and the pressure was set to 5 kg/cm$^2$. After that, the heating was stopped, and cooling was performed by heat dissipation. The depressurizing of the space in which the radiation detecting apparatus was arranged and the pressurizing of the space opposite to the side on which the radiation detecting apparatus was arranged were stopped. Then, the radiation detecting apparatus was taken out of the vacuum pressing apparatus.

Next, a predetermined region of the scintillator protection layer 8 adhered closely on the scintillator foundation layer 6 of the taken out radiation detecting apparatus was heated and pressurized (hot press processing) using a heating press apparatus including a heating press portion of 430 mm×3 mm in size, and thereby the scintillator protection layer 8 entered so that the scintillator protection layer 8 might fill up asperities caused by the wire intervals on the scintillator foundation layer 6. Then, a hot press portion 14 was formed to be thinner than the layer thicknesses of the other region of the scintillator protection layer 8. By the formation of the hot press portion 14, the gap portions 31 (see FIG. 3B) capable of being generated by asperities can be filled up, and consequently the advantages such as the improvement of the adhesion property of the scintillator foundation layer 6 and the scintillator protection layer 8, and the improvement of the moisture resistance in the interface between the scintillator foundation layer 6 and the scintillator protection layer 8 could be obtained. The hot press processing was performed to each side of the radiation detecting apparatus, and the radiation detecting apparatus received the hot press processing was obtained. The hot press processing was performed at a heating temperature 170° C. under the pressurization pressure of 5 kg/cm$^2$, and for a heating and pressurizing time of 10 seconds.

Next, a wire member 12 was connected to a wire connecting portion 11 by the same method as those of the examples 1 and 2 to the radiation detecting apparatus having received the hot press processing, and the radiation detecting apparatus shown in FIG. 1 was obtained.

The radiation detecting apparatus produced as mentioned above was saved in a temperature and humidity test tub at 60° C. and 90% for 1000 hours. As a result, defective appearances such as displacement of the scintillator layer 7 and exfoliation between each layer were not produced. Moreover, deterioration of the emitted light intensity by corrosion and deliquescence caused by water or a solvent of the scintillator layer 7 was not observed at all. Thus, the radiation detecting apparatus of high reliability was obtained.

EXAMPLE 6

In the present example, the same radiation detecting apparatus as that of the example 5 was manufactured by the same method as that of the example 5 except for the use of a hot-melt resin material different from the hot-melt resin material used for the scintillator protection layer 8 of the example 5.

A scintillator layer 7 consisting of CsI:Tl of the columnar crystal structure was acquired by the same method as those of the examples 1 and 2 on the scintillator foundation layer 6 on a photoreceiving layer 15 of a sensor panel 16 acquired by the same method as those of the examples 1 and 2.

Next, a hot-melt resin containing an ethylene-acrylic acid copolymer as the principal member was provided as the scintillator protection layer 8 on the laminated sheet by 75 μm in thickness by the same method as that of the example 2, and the scintillator protection sheet consisting of a laminated structure of the scintillator protection layer 8, a reflective layer 9 and a reflective layer protection layer 10 was obtained. In the present example, H-2200 (made by Kurabo Industries) was used as the hot-melt resin containing the ethylene-acrylic acid copolymer as the principal member similarly in the example 4.

Next, by the method similar to that of the example 5, a radiation detecting apparatus having received the hot press processing was acquired. Here, the heating and press bonding treatment was performed under the conditions in which the temperatures of the heating heater 29 and the heating stage 30 of the vacuum pressing apparatus were set to 130° C., the pressurizing time was set to one minute, and the pressure was set to 5 kg/cm$^2$. Moreover, the hot press processing was performed at a heating temperature 170° C. under the pressurization pressure of 5 kg/cm$^2$, and for a heating and pressurizing time of 10 seconds.

Next, a wire member 12 was connected to a wire connecting portion 11 by the same method as those of the examples 1 and 2 to the radiation detecting apparatus having received the hot press processing, and the radiation detecting apparatus shown in FIG. 1 was obtained.

The radiation detecting apparatus produced as mentioned above was saved in a temperature and humidity test tub at 60° C. and 90% for 1000 hours. As a result, defective appearances such as displacement of the scintillator layer 7 and exfoliation between each layer were not produced. Moreover, deterioration of the emitted light intensity by corrosion and deliquescence caused by water or a solvent of the scintillator layer 7 was not observed at all. Thus, the radiation detecting apparatus of high reliability was obtained.

EXAMPLE 7

In the present example, the same radiation detecting apparatus as that of the example 5 was manufactured by the same method as that of the example 5 except for the use of a hot-melt resin material different from the hot-melt resin material used for the scintillator protection layer 8 of the example 5.

A scintillator layer 7 consisting of CsI:Tl of the columnar crystal structure was acquired by the same method as those of the examples 1 and 2 on the scintillator foundation layer 6 on a photoreceiving layer 15 of a sensor panel 16 acquired by the same method as those of the examples 1 and 2.

Next, a hot-melt resin containing an ethylene-acrylic ester copolymer as the principal member was provided as the scintillator protection layer 8 on the laminated sheet by 150 μm in thickness by the same method as that of the example 2, and the scintillator protection sheet consisting of a laminated structure of the scintillator protection layer 8, a reflective layer 9 and a reflective layer protection layer 10 was obtained. In the present example, Z-2 (made by Kurabo Industries) was used as the hot-melt resin containing the ethylene-acrylic ester copolymer as the principal member similarly in the example 4.

Next, by the method similar to that of the example 5, a radiation detecting apparatus having received the hot press processing was acquired. Here, the heating and press bonding treatment was performed under the conditions in which the temperatures of the heating heater 29 and the heating stage 30 of the vacuum pressing apparatus were set to 130° C., the pressurizing time was set to one minute, and the pressure was set to 5 kg/cm². Moreover, the hot press processing was performed at a heating temperature 170° C. under the pressurization pressure of 5 kg/cm², and for a heating and pressurizing time of 10 seconds.

Next, a wire member 12 was connected to a wire connecting portion 11 by the same method as those of the examples 1 and 2 to the radiation detecting apparatus having received the hot press processing, and the radiation detecting apparatus shown in FIG. 1 was obtained.

The radiation detecting apparatus produced as mentioned above was saved in a temperature and humidity test tub at 60° C. and 90% for 1000 hours. As a result, defective appearances such as displacement of the scintillator layer 7 and exfoliation between each layer were not produced. Moreover, deterioration of the emitted light intensity by corrosion and deliquescence caused by water or a solvent of the scintillator layer 7 was not observed at all. Thus, the radiation detecting apparatus of high reliability was obtained.

EXAMPLE 8

The present example is an example of the second embodiment and the direct deposition type radiation detecting apparatus shown in FIG. 9.

In the present example, the same radiation detecting apparatus as that of the example 7 was manufactured by the same method as that of the example 5 except that the warp correction layer 33 for correcting the warp generated in the sensor panel 16 owing to the differences of the thermal expansion and thermal contraction between the sensor panel 16 and the scintillator protection layer 8 was provided on the back surface of the sensor panel 16 of the example 7.

A scintillator layer 7 consisting of CsI:Tl of the columnar crystal structure was acquired by the same method as those of the examples 1 and 2 on the scintillator foundation layer 6 on a photoreceiving layer 15 of a sensor panel 16 acquired by the same method as those of the examples 1 and 2.

Next, a hot-melt resin containing an ethylene-acrylic ester copolymer as the principal member was provided as the scintillator protection layer 8 on the laminated sheet by 150 μm in thickness by the same method as that of the example 2, and the scintillator protection sheet consisting of a laminated structure of the scintillator protection layer 8, a reflective layer 9 and a reflective layer protection layer 10 was obtained. In the present example, Z-2 (made by Kurabo Industries) was used as the hot-melt resin containing the ethylene-acrylic ester copolymer as the principal member similarly in the example 4.

Next, by the method similar to that of the example 5, a radiation detecting apparatus having received the hot press processing was acquired. Here, the heating and press bonding treatment was performed under the conditions in which the temperatures of the heating heater 29 and the heating stage 30 of the vacuum pressing apparatus were set to 130° C., the pressurizing time was set to one minute, and the pressure was set to 5 kg/cm². Moreover, the hot press processing was performed at a heating temperature 170° C. under the pressurization pressure of 5 kg/cm², and for a heating and pressurizing time of 10 seconds. At the heating and press bonding treatment, a PET was provided as the warp correction layer 33 on the side of the glass substrate 1 of the sensor panel 16 with a hot-melt resin of H-250 (made by Kurabo Industries) as an adhesion material layer 32 put between the PET and the sensor panel 16. By adopting the configuration mentioned above, the thermal expansion coefficients of the hot-melt resin of the scintillator protection layer 8 and the thermal expansion coefficient of the hot-melt resin of the adhesion material layer 32, and the thermal expansion coefficient of the PET of the reflective layer protection layer 10 and the thermal expansion coefficient of the PET of the warp correction layer 33 became equal to each other, and consequently the radiation detecting apparatus could be formed without generating any warp in the sensor panel 16.

Next, a wire member 12 was connected to a wire connecting portion 11 by the same method as those of the examples 1 and 2 to the radiation detecting apparatus having received the hot press processing, and the radiation detecting apparatus shown in FIG. 9 was obtained.

The radiation detecting apparatus produced as mentioned above was saved in a temperature and humidity test tub at 60° C. and 90% for 1000 hours. As a result, defective appearances such as a displacement of the scintillator layer 7 and exfoliation between each layer were not generated. Moreover, the deterioration of the emitted light intensity by the corrosion and the deliquescence caused by water or a solvent of the scintillator layer 7 was not recognized at all. Thus, the radiation detecting apparatus of high reliability was obtained.

EXAMPLE 9

The present example is an example of the third embodiment, the scintillator panel shown in FIGS. 10A, 10B, 11A and 11B, and a paste together type radiation detecting apparatus using the scintillator panel.

In an region of 430 mm×430 mm on a glass substrate 1 having a thickness of 0.7 mm, a photoreceiving layer 15 was formed by arranging two-dimensionally pixels each having a pixel size of 160 μm×160 μm which pixel consisted of a photodiode (photoelectric conversion element) 2 made of amorphous silicon, a TFT (not shown) and an Al wire 3. Moreover, in the surrounding region of the glass substrate 1, an Al fetch wire 4 for the electrical connection with a wire member 12 such as an IC reading the photoelectric conversion information read from the photoreceiving layer 15, and a wire connecting portion 11 were formed. After that, a sensor protection layer 5 consisting of SiN and a passivation film 6 consisting of polyimide were formed except for the region in which the wire connecting portion 11 was formed, and a sensor panel 16 was obtained.

Next, as shown in FIGS. 10A and 10B, a reflective layer 42 was formed by evaporating Al to be a thickness of 3000 angstroms on a supporting substrate 41 made of amorphous carbon having a thickness of 1 mm, and a scintillator foundation layer (reflective layer protection layer) 43 made of polyimide was formed so as to cover the surface of the supporting substrate 41 on the side on which the reflective layer 42 was formed. Thus a supporting member was acquired. Next, CsI:Tl of a columnar crystal structure in which thallium (Tl) was added to cesium iodide (CsI) was formed on the scintillator foundation layer 42 to be 550 μm in thickness by the vacuum evaporation method in a film formation time of four hours. The addition concentration of Tl was within a range of from 0.1 to 0.3 mol %. The column diameter on the side of the top face of the columnar crystal of CsI:Tl (on the side of the surface of evaporation end) was about 5 μm in an average. A scintillator layer 7 was obtained by heat-treating the formed CsI:Tl within a clean oven under 200° C. nitrogen atmosphere for two hours. Next, a hot-melt resin containing ethylene-acrylic ester copolymer as the principal member was melted at 140° C. A hot-melt resin having a thickness of 100 μm and covering the surface of the scintillator foundation layer 43 in the region surrounding the region in which the scintillator layer 7 was provided (the region between the end of the scintillator layer 7 and the end of the scintillator foundation layer 43), the side faces and the top face of the scintillator layer 7 was formed using dye coater 17. At room temperature, the heat of the formed hot-melt resin was dissipated, and the hot-melt resin was solidified. Thus, a scintillator protection layer 8 consisting of the hot-melt resin was obtained. In the present example, Z-2 (manufactured by Kurabo Industries) was used as the hot-melt resin containing ethylene-acrylic ester copolymer as the principal member. A scintillator panel 40 was acquired by the configuration and the manufacturing processes described above.

Then a sensor panel 16 was prepared on the acquired scintillator panel 40, and they were placed on the heating stage 30 in the vacuum pressing apparatus. The space of the press member 31 on the side on which the radiation detecting apparatus was arranged was depressurized, and at the same time the space of the press member 31 on the side opposite to the side on which the radiation detecting apparatus was arranged was pressurized. Moreover, heating was performed from the sensor panel side with the heating stage 30, and the inside of the vacuum pressing apparatus was heated with the heater 29. Thereby, the hot-melt resin was melted, and the sensor panel 16 and the scintillator panel 40 were adhered to each other. Here, the adhesion treatment was performed under the conditions in which the temperatures of the heating heater 29 and the heating stage 30 of the vacuum pressing apparatus were 140° C., the pressurization time was for three minutes, and the pressure was 5 kg/cm. After that, heating was stopped, and the hot-melt resin was cooled by heat dissipation, and the depressurization of the space in which the radiation detecting apparatus was arranged and the pressurization of the space on the side opposite to the space in which the radiation detecting apparatus was arranged were stopped. Then, the radiation detecting apparatus was taken out of the vacuum pressing apparatus. The radiation detecting apparatus formed by adhering the scintillator panel 40 with the sensor panel 16 was obtained by the configuration and the manufacturing processes described above.

Next, the wire member 12 was connected to the wire connecting portion 11 by the same method as that of the example 1 to the acquired radiation detecting apparatus. Moreover, a sealing member 11 consisting of a flowable silicone resin (TES 325, manufactured by GE Toshiba Silicones) and a sealing material 45 consisting of a semi-flowable silicone (TSE 3253, manufactured by GE Toshiba Silicones) ware formed. Thus, the radiation detecting apparatus shown in FIG. 11B was obtained.

The radiation detecting apparatus produced as mentioned above was saved in a temperature and humidity test tub at 60° C. and 90% for 1000 hours. As a result, no defective appearances such as displacement of the scintillator layer 7 and exfoliation between each layer were produced. Moreover, deterioration of the light intensity of the scintillator layer 7 owing to corrosion and deliquescence caused by water or the solvent was not observed at all. Consequently, a radiation detecting apparatus of high reliability was obtained.

The temperature dependency of the viscosity of melted hot-melt resin of the hot-melt resin used in the above-mentioned examples is shown in Table 1.

TABLE 1

| material 7544 | temperature dependency of viscosity of melted hot-melt resin (Pa · s × 10³) | | | | | | | |
|---|---|---|---|---|---|---|---|---|
| | 100° C. | 110° C. | 120° C. | 130° C. | 140° C. | 150° C. | 160° C. | 170° C. |
| O-4121 | — | 5 | 3.3 | 1.8 | — | — | — | — |
| W-4110 | 2.7 | 1.6 | 1 | 0.9 | — | — | — | — |
| H-2500 | — | 3.5 | 2.3 | 1.6 | 1 | — | — | — |
| P-2200 | — | — | 10 | 4.3 | 2.3 | 1.3 | — | — |
| Z-2 | — | — | 5.4 | 3.2 | 1.9 | 1.1 | 0.7 | 0.4 |

INDUSTRIAL APPLICABILITY

The present invention is used for radiation detecting apparatus and the scintillator panel which are used for medical diagnostics apparatus, non-destructive test apparatus, and the like.

This application claims priority from Japanese Patent Application No. 2004-233417 filed Aug. 10, 2004, which is hereby incorporated by reference herein.

The invention claimed is:

1. A manufacturing method of a radiation detecting apparatus including a panel, a scintillator layer of a material containing as a main ingredient alkali halide and of a columnar crystal structure formed on the panel to convert radiation into light, and a scintillator protection layer covering the scintillator layer to adhere closely to the scintillator protection layer, said method comprising steps of:
    preparing the panel, on which the scintillator layer is to be formed;
    providing a melted hot-melt resin to cover the scintillator layer directly for forming the scintillator protection layer, wherein the hot-melt resin is formed of a material which does not dissolve the scintillator layer even though the scintillator protection layer contacts the scintillator layer; and
    pressing by means of a pressing unit the hot-melt resin to reduce a thickness of the hot-melt resin in a region in which the hot-melt resin contacts the panel at a periphery of the scintillator layer, with a lesser to no reduction in the thickness of the hot-melt resin in a region in which the hot-melt resin contacts the scintillator layer.

2. A manufacturing method of a scintillator panel according to claim 1, further comprising:
    a step of stacking, on the scintillator protection layer, a reflection layer and a protection layer of the reflection layer.

3. A manufacturing method of a radiation detecting apparatus according to claim 1, wherein the panel has a wiring for transferring a signal to an external recipient of the signal, at a portion of the panel corresponding to the region in which the thickness of the hot-melt resin is reduced.

4. A manufacturing method of a radiation detecting apparatus including a panel, a scintillator layer of a material containing as a main ingredient alkali halide and of a columnar crystal structure formed on the panel to convert radiation into light, and a scintillator protection layer covering the scintillator layer to adhere closely to the panel, said method including:
    a first step of forming a hot-melt resin to form the scintillator protection layer;
    a second step of preparing the panel, on which the scintillator layer is to be formed, and adhering the hot melt resin closely to the scintillator layer and the panel so that the hot melt resin covers the scintillator layer directly, wherein the hot-melt resin is formed of a material which does not dissolve the scintillator layer even though the scintillator protection layer contacts the scintillator layer; and pressing by means of a pressing unit the hot-melt resin to reduce a thickness of the hot-melt resin in a region in which the hot-melt resin contacts the panel at a periphery of the scintillator layer, with a lesser to no reduction in the thickness of the hot-melt resin in a region in which the hot-melt resin contacts the scintillator layer.

5. A manufacturing method of a scintillator panel according to claim 4, further comprising:

a step of stacking, on the scintillator protection layer, a reflection layer and a protection layer of the reflection layer.

6. A manufacturing method of a radiation detecting apparatus according to claim 4, wherein the panel has a wiring for transferring a signal to an external recipient of the signal, at a portion of the panel corresponding to the region in which the thickness of the hot-melt resin is reduced.

7. A manufacturing method of a scintillator panel including a supporting member, a scintillator layer of a material containing as a main ingredient alkali halide and of a columnar crystal structure formed on the supporting member to convert radiation into light, and a scintillator protection layer covering the scintillator layer to adhere closely to the scintillator protection layer, said method comprising the step of:

preparing the supporting member, on which the scintillator layer is to be formed;

applying melted hot-melt resin directly to cover the scintillator layer for forming the scintillator protection layer, wherein the hot-melt resin is formed of a material which does not dissolve the scintillator layer even though the scintillator protection layer contacts the scintillator layer; and pressing by means of a pressing unit the hot-melt resin to reduce a thickness of the hot-melt resin in a region in which the hot-melt resin contacts the supporting layer at a periphery of the scintillator layer, with a lesser to no reduction in the thickness of the hot-melt resin in a region in which the hot-melt resin contacts the scintillator layer.

8. A manufacturing method of a scintillator panel according to claim 7, wherein the pressing by means of a pressing unit is conducted at a periphery of a region in which the reflection layer is formed.

9. A manufacturing method of a scintillator panel including a supporting member, a scintillator layer of a material containing as a main ingredient alkali halide and of a columnar crystal structure formed on the supporting member to convert radiation into light, and a scintillator protection layer covering the scintillator layer to adhere closely to the supporting member, said method comprising:

a first step of forming a hot melt resin to form the scintillator protection member;

a second step of preparing the supporting member, on which the scintillator layer is to be formed, and adhering the hot melt resin closely to the scintillator layer and the supporting member so that the hot melt resin may cover the scintillator layer directly, wherein the hot-melt resin is formed of a material which does not dissolve the scintillator layer even though the scintillator protection layer contacts the scintillator layer; and pressing by means of a pressing unit the hot-melt resin to reduce a thickness of the hot-melt resin in a region in which the hot-melt resin contacts the supporting layer at a periphery of the scintillator layer, with a lesser to no reduction in the thickness of the hot-melt resin in a region in which the hot-melt resin contacts the scintillator layer.

10. A manufacturing method of a scintillator panel according to claim 9, wherein the pressing by means of a pressing unit is conducted at a periphery of a region in which the reflection layer is formed.

11. A manufacturing method of a radiation detecting apparatus according to claim 1 or 4, wherein the pressing by means of a pressing unit comprises heating and pressing by means of a heating and pressing unit.

12. A manufacturing method of a scintillator panel according to claim 7 or 9, wherein the pressing by means of a pressing unit is heating and pressing by means of a heating and pressing unit.

* * * * *